US012727169B2

(12) United States Patent
Li et al.

(10) Patent No.: US 12,727,169 B2
(45) Date of Patent: Sep. 1, 2026

(54) THERMALLY ENHANCED SELECTOR STRUCTURE AND METHODS OF FORMING THE SAME

(71) Applicant: Taiwan Semiconductor Manufacturing Company Limited, Hsinchu (TW)

(72) Inventors: Hung-Ju Li, Hsinchu City (TW); Kuo-Pin Chang, Hsinchu (TW); Yu-Wei Ting, Taipei City (TW); Yu-Sheng Chen, Hsinchu (TW); Ching-En Chen, Chiayi City (TW); Kuo-Ching Huang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 1062 days.

(21) Appl. No.: 17/849,755

(22) Filed: Jun. 27, 2022

(65) Prior Publication Data

US 2023/0422517 A1 Dec. 28, 2023

(51) Int. Cl.
*H10B 63/00* (2023.01)

(52) U.S. Cl.
CPC .................................... *H10B 63/24* (2023.02)

(58) Field of Classification Search
CPC .............................. H10B 63/24; H10N 70/841
See application file for complete search history.

(56) References Cited

U.S. PATENT DOCUMENTS

| | | | | |
|---|---|---|---|---|
| 11,903,334 | B2 * | 2/2024 | Chiang | H10B 63/20 |
| 2016/0218283 | A1 * | 7/2016 | Trinh | H10N 70/8833 |
| 2018/0159030 | A1 * | 6/2018 | Park | H10B 63/24 |
| 2020/0005863 | A1 * | 1/2020 | Grobis | H10N 70/231 |
| 2020/0136038 | A1 * | 4/2020 | Manfrini | H10N 70/20 |
| 2023/0309428 | A1 * | 9/2023 | Fukuda | H10N 70/063 |

FOREIGN PATENT DOCUMENTS

| | | | |
|---|---|---|---|
| TW | 200623399 | A | 7/2006 |
| TW | 201332087 | A | 8/2013 |
| WO | 2016153515 | A1 | 9/2016 |

OTHER PUBLICATIONS

Chinese Patent and Trademark Office; CN Application No. 202310463168.5; first Office Action mailed May 29, 2026; 20 pages.

* cited by examiner

*Primary Examiner* — Mounir S Amer
(74) *Attorney, Agent, or Firm* — The Marbury Law Group, PLLC

(57) ABSTRACT

A selector structure may include a bottom electrode including a bottom low thermal conductivity (LTC) metal and a first bottom high thermal conductivity (HTC) metal, a first switching film on the bottom electrode and having an electrical resistivity switchable by an electric field, and a first top electrode on the first switching film and including a first top low thermal conductivity (LTC) metal and a first top high thermal conductivity (HTC) metal.

20 Claims, 18 Drawing Sheets

160a
140

160a
140
O2
140
120a
200
120b

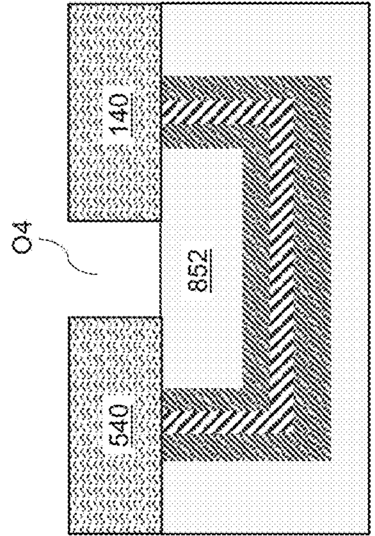
FIG. 8F
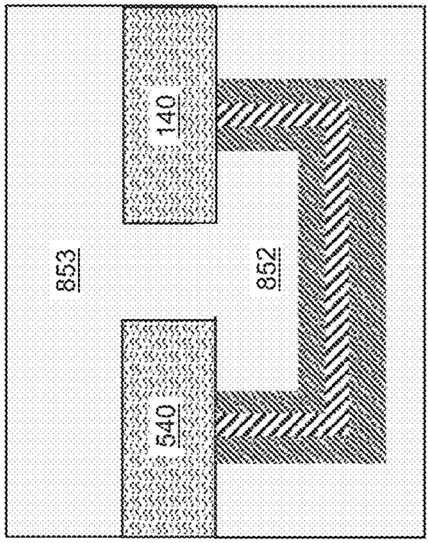
FIG. 8G
140-L
120b
850
120a
120
852
125
520b
FIG. 8E

THERMALLY ENHANCED SELECTOR STRUCTURE AND METHODS OF FORMING THE SAME

BACKGROUND

A memory cell of a memory device may include a selector connected in series with a resistive element. Such a memory cell may be referred to as a one selector, one resistive element (1S1R) memory element. The selector may help to suppress a leakage current during operation of the memory device. The resistive element may include, for example, a non-volatile memory (NVM) element. In particular, a top electrode (TE) of the selector may be connected to a bottom of the NVM. In many memory devices, the selector element may be formed from a material with low leakage current characteristics that include high threshold voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8E illustrates an intermediate structure after forming of a switching film layer, according to one or more embodiments.

FIG. 8F illustrates an intermediate structure after forming an opening in the switching film layer, according to one or more embodiments.

FIG. 8G illustrates an intermediate structure after forming a third dielectric layer, according to one or more embodiments.

DETAILED DESCRIPTION

Figure 1B:
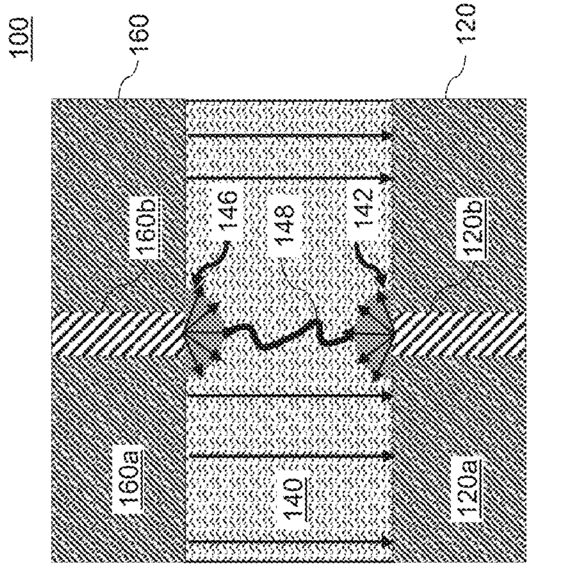
FIG. 1B is a schematic diagram of the selector structure under the influence of an electric field, according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A typical memory cell selector may include, for example, an ovonic threshold switch (OTS) selector. The OTS selector may include an OTS-based film (e.g., a Se film, Te film, Ge film, etc.) located between two other materials. The two other materials may be referred to as a top electrode (TE) and bottom electrode (BE) according to a relative location compared to the OTS-based film. Both the top electrode and bottom electrode may typically be formed from a low thermal conductivity (LTC) metal.

The typical OTS selector may include a filamentary conduction (e.g., a filament of electrical conductivity). That is, in an off state (e.g., an initial state) conductive atoms may be dispersed in the OTS-based film. However, under the influence of an applied external electric field (e.g., in an on state or excited state) a filament of the conductive atoms may be formed in a random area of the OTS-based film. That is, the filament may occur randomly under the influence of an electric field. A direction of the filamentary conduction (e.g., from the top electrode to the bottom electrode) may be controlled by the external electric field.

It is therefore desirable for the OTS selector to inhibit a leakage current, so a material to form the OTS-based film (e.g., an OTS-based material) may be selected for that purpose. However, materials that provide a low leakage current also have a high threshold voltage characteristics. Such high threshold voltage characteristics may be undesirable. Thus, it is desired to design and make an OTS selector that provides a low leakage current with a low threshold voltage.

One or more embodiments of the present disclosure may include a selector structure (e.g., OTS selector structure or thermally enhanced selector structure) that may include a local thermal enhancement structure (LTES) of the top electrode and/or bottom electrode. The selector structure may, therefore, be referred to as LTES-OTSS. The selector structure may have both a low leakage current with a low threshold voltage. In contrast to typical OTS selectors which are only electrically driven, the selector structure having LTES may be both electrically driven and thermally driven. Unlike a typical OTS selector in which a filament of conductive atoms may be formed in a random area of the OTS-based film, in various embodiment selector structures, a filament of conductive atoms may include a "localized filament" that is formed locally (e.g., in close proximity to a high-thermal resistance area of the top and bottom electrodes).

In particular, the selector structure may include a switching film (e.g., OTS-based film) formed between the top electrode and bottom electrode. The switching film may have an electrical conductivity that is switchable in the presence of an external electric field. That is, the electrical conductivity of the switching film may be switched by applying a voltage across the film (e.g., in a thickness direction).

The top electrode and/or bottom electrode of the selector structure may include both a low thermal conductivity (LTC) metal and a high thermal conductivity (HTC) metal. The LTC metal may have a low electrical resistivity and, thus, may provide for electrical conductivity. The HTC metal may have a high electrical resistivity and, thus, may provide for high local thermal heating.

With thermal assistance from the HTC metal (e.g., a local heater), an operating bias of a memory cell may be reduced (e.g., switching efficiency of the memory cell may be improved). As a result, the threshold voltage of the selector structure may be reduced without increasing a leakage current. Thus, the selector structure may be used for a low-power memory application.

The switching film (e.g., OTS-based film) may have a thickness in a range from about 5 nm to about 50 nm, although thicker or thinner films may be used. The top electrode and bottom electrode may each have a thickness in a range from about 1 nm to 500 nm, although greater or lesser thicknesses may be used. The thickness of the top electrode may be substantially the same as a thickness of the bottom electrode. A thermal conductivity ratio of the LTC metal to the HTC metal may be in a range of about 1:10 to about 1:10,000. An electrical connection to the top and bottom electrodes may be at a central region (e.g., in a lateral direction) of the top and bottom electrodes.

One or more embodiments of the selector structure may have a low threshold voltage under a high temperature. The selector structure may be driven by an electric field, but a temperature of the selector structure's environment (e.g., temperature of the switching film in the selector structure) may play a role of assistant energy for switching. That is, the HTC metal may be considered to be a heating element (e.g., heater) that may generate thermal energy proportional to an applied voltage. The selector structure may have a threshold voltage that may be inversely proportional to a temperature of the selector structure (e.g., a temperature of the OTS-based film).

In one or more embodiments, a contact area ratio between the LTC metal and HTC metal should be great enough to generate current crowding. A contact area ratio of LTC metal and HTC metal may be in a range of about 1:1 to about 10,000:1.

An extended configuration (e.g., U-shaped configuration) of a bottom electrode of the selector structure may provide an effective area for a memory array application. A characteristic (e.g., operating characteristic) of a selector structure having a bottom electrode with the extended configuration may be consistent with a selector structure having a bottom electrode with a basic configuration.

Either metal thickness or the switching film (e.g., OTS-based film) can change current crowding. A thin thickness of the switching film may cause high current crowding between the electrode and the switching film. A high current crowding may generate localized heating (e.g., thermal energy) which may reduce operating bias. That is, an important aspect may include creating an electrical resistance ratio between the HTC metal and the switching film. A high electrical resistance ratio may result in high current crowding which may result in a high heating rate.

The selector structure may provide a benefit for memory array design in terms of area. In particular, the selector structure may provide a common word line for two memory cells, and each of the memory cells can be operated independently of each other. Thus, the selector structure may reduce a total area of a memory array.

In addition, one or more embodiments may provide a reduced total power consumption as compared to the typical OTS selector. A typical OTS selector may need a higher write voltage ($V_{write}$) to prevent operation failure due to high leakage current. However, an array with the selector structure (LTES OTSS), may have a low power consumption as a consequence of the low leakage current in the selector structure.

The selector structure may also provide a greater (e.g., wider) read voltage ($V_{read}$) window than a typical OTS selector due to the selector structure having a lower threshold voltage than the typical OTS selector. A $V_{read}$ window may be determined by the difference of NVM's setting voltage ($V_{set}$) and the selector structure's threshold voltage (Vt) (e.g., $V_{read}$ window=NVM $V_{set}$−Selector $V_t$). Thus, a memory array in including the selector structure (LTES OTSS) may have a low threshold voltage leading to a greater read margin (e.g., wider read margin) for operation.

The selector structure may have, for example, a cylinder shape, such as a circular cylinder shape, square cylinder shape (cuboid shape), etc. In one or more embodiments a cross-sectional view along a height of the selector structure may be uniform (e.g., a shape of a cross-section taken along a plane parallel to an interface between the OTS based film and one of the top and bottom electrodes). A contact area ratio of LTC metal to HTC metal may be designed as proportional to electrical conductivity.

In one or more embodiments, a width of the HTC metal may vary. In particular, the width may decrease in a direction toward the switching film. That is, with respect to the switching film, a distal width of the HTC metal at a distal end of HTC metal may be greater than a proximal width of the HTC metal at a proximal end of the HTC metal. In one or more embodiments, as a difference between of distal width and proximal width, increases, a performance (e.g., efficiency) of the selector structure may increase.

Figure 1A:
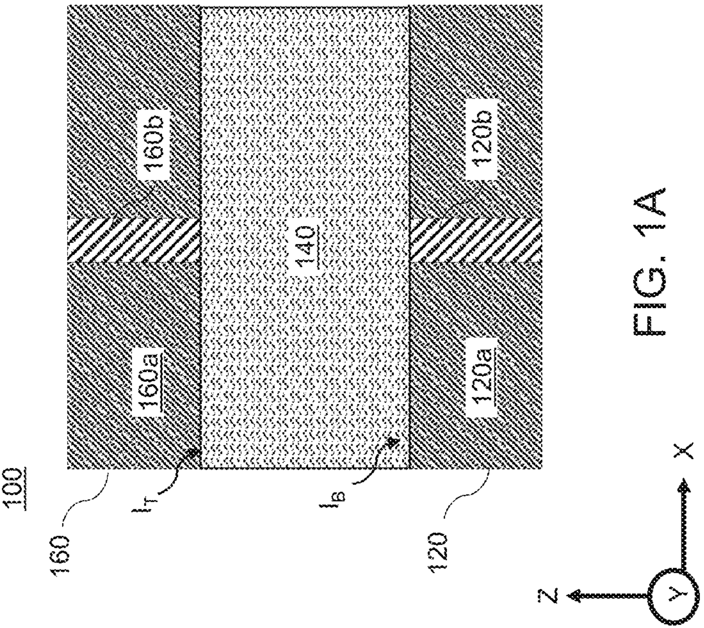
FIG. 1A is a cross-sectional view of a selector structure (e.g., Ovonic Threshold Switching (OTS) selector) having a basic configuration, according to one or more embodiments.

FIG. 1A is a vertical cross-sectional view of a selector structure 100 (e.g., OTS selector) having a basic configuration, according to one or more embodiments. As illustrated in FIG. 1A, the selector structure 100 may include a bottom electrode 120 including a bottom low thermal conductivity (LTC) metal 120*a* and a first bottom high thermal conductivity (HTC) metal 120*b*. The first bottom HTC metal 120*b* may be located, for example, in a central region (e.g., in the x-y plane) of the bottom electrode 120 and the bottom LTC metal 120*a* may be on opposing sides of the first bottom HTC metal 120*b*. In particular, the bottom LTC metal 120*a* may substantially surround the first bottom HTC metal 120*b* in the x-y plane.

Each of the bottom LTC metal 120*a* and a first bottom HTC metal 120*b* may include a metal material (e.g., metal, metal alloy, etc.) having a high electrical conductivity (e.g., about $1\times10^7$ Siemens/meter or greater). The metal material may include, for example, one or more of copper, gold, silver, aluminum, tungsten, nickel, platinum and tungsten nitride. A thickness of the bottom electrode 120 may be in a range from about 1 nm to about 500 nm. A thermal conductivity of the first bottom HTC metal 120*b* may be greater than a thermal conductivity of the bottom LTC metal 120*a*. In particular, a ratio of the thermal conductivity of the bottom LTC metal 120*a* to a thermal conductivity of the first bottom HTC metal 120*b* may be in a range from about 1:10 to about 1:10,000.

The selector structure 100 may also include a first switching film 140 on the bottom electrode 120. The first switching film 140 may include a film having an electrical resistivity switchable by an electric field. That is, the electrical conductivity of the first switching film 140 may be switched by applying a voltage across the film (e.g., in a thickness direction) that induces an electric field.

The first switching film 140 may include, for example, an OTS-based film including one or more of selenium, tellurium and germanium. The first switching film 140 may also include one or more dopants that may be used to manipulate a characteristic of the first switching film 140. Such dopants may include, for example, one or more of As, Si, Sb, N, C and B. A thickness of the switching film 140 (e.g., OTS-based film) may be in a range of about 5 nm to about 50 nm.

The selector structure 100 may also include a first top electrode 160 on the first switching film 140. The first top electrode 160 may have a structure that is substantially the same as a structure of the bottom electrode 120. The first top electrode 160 may include a first top LTC metal 160*a* and a first top HTC metal 160*b*. The first top HTC metal 160*b* may be located, for example, in a central region (e.g., in the x-y plane) of the first top electrode 160 and the first top LTC metal 160*a* may be on opposing sides of the first top HTC metal 160*b*. In particular, the first top LTC metal 160*a* may substantially surround the first top HTC metal 160*b* in the x-y plane.

Each of the first top LTC metal 160*a* and a first top HTC metal 160*b* may include a metal material (e.g., metal, metal alloy, etc.) having a high electrical conductivity (e.g., about $1\times10^7$ Siemens/meter or greater). The metal material may include, for example, one or more of copper, gold, silver, aluminum, tungsten, nickel, platinum and tungsten nitride. A thickness of the first top electrode 160 may be in a range from about 1 nm to about 500 nm. The thickness of the first top electrode 160 may be substantially the same as a thickness of the bottom electrode 120. A thermal conductivity of the first top HTC metal 160*b* may be greater than a thermal conductivity of the first top LTC metal 160*a*. In particular, a ratio of the thermal conductivity of the first top LTC metal 160*a* to a thermal conductivity of the first top HTC metal 160*b* may be in a range from about 1:10 to about 1:10,000.

It should be noted that at the interface $I_B$ between the switching film 140 and the bottom electrode 120, a contact area ratio of the contact area between the switching film 140 and the bottom LTC metal 120*a* and the contact area between the switching film 140 and the first bottom HTC metal 120*b* should be great enough to generate current crowding. In particular, the contact area ratio may be in a range of about 1:1 to about 10,000:1.

In addition, at the interface $I_T$ between the switching film 140 and the first top electrode 160, a contact area ratio of the contact area between the switching film 140 and the first top LTC metal 160*a* and the contact area between the switching film 140 and the first top HTC metal 160*b* should also be great enough to generate current crowding. In particular, the contact area ratio may also be in a range of about 1:1 to about 10,000:1.

FIG. 1B is a schematic diagram of the selector structure 100 in operation under the influence of an electric field, according to one or more embodiments. The electric field (indicated by the downward arrows in FIG. 1B) may be generated, for example, by applying a top voltage to the first top electrode 160 and a bottom voltage less than the top voltage to the bottom electrode 120.

Generally, the selector structure 100 may include a local thermal enhancement structure (LTES) of the top electrode and/or bottom electrode. The selector structure 100 having LTES may be both electrically driven and thermally driven. The bottom LTC metal 120*a* and first top LTC metal 160*a* may have a low electrical resistivity and, thus, may provide for electrical conductivity. The first bottom HTC metal 120*b* and first top HTC metal 160*b* may have a high electrical resistivity and, thus, may provide for high local thermal heating.

In particular, the first bottom HTC metal 120*b* may generate a bottom thermal energy 142 in the switching film 140, and the first top HTC metal 160*b* may generate a top thermal energy 146 in the switching film 140. As a result, a localized filament 148 of conductive atoms may be formed locally in close proximity to the first bottom HTC metal 120*b* and the first top HTC metal 160*b*.

Thus, the various embodiment selector structures that include a central first bottom HTC metal 120*b* and the first top HTC metal 160*b* surrounded by a first bottom LTC metal 120*a* and first top LTC metal 160*a*, respectively may benefit from the thermal assistance that results from the first bottom HTC metal 120*b* and first top HTC metal 160*b* (e.g., local heaters), an operating bias of a memory cell including the selector structure 100 may be reduced (e.g., switching efficiency of the memory cell may be improved), so as to reduce the threshold voltage without increasing a leakage current. Thus, the selector structure 100 may be used in a variety of low-power memory applications.

The selector structure 100 may have a low threshold voltage under a high temperature. The selector structure 100 may be driven by the electric field, but a temperature of an environment of the selector structure 100 (e.g., temperature of the switching film 140 in the selector structure 100) may play a role of assistant energy for switching. That is, each of the first bottom HTC metal 120*b* and the first top HTC metal 160*b* may be considered to be a heating element (e.g., heater) that may generate thermal energy proportional to a voltage that is applied to the selector structure 100. The selector structure 100 may have a threshold voltage inversely proportional to a temperature of the selector structure 100 (e.g., a temperature of the switching film 140).

Figure 2B:
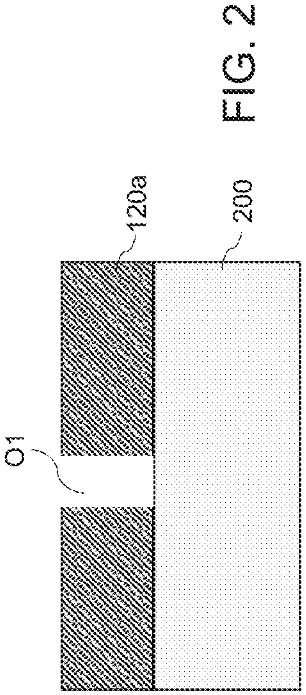
FIG. 2B illustrates an intermediate structure after forming an opening in the bottom LTC metal, according to one or more embodiments.
Figure 2D:
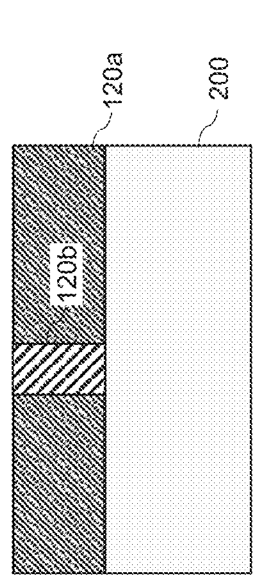
FIG. 2D illustrates an intermediate structure after planarizing the bottom LTC metal and the first bottom HTC metal, according to one or more embodiments.
Figure 2A:
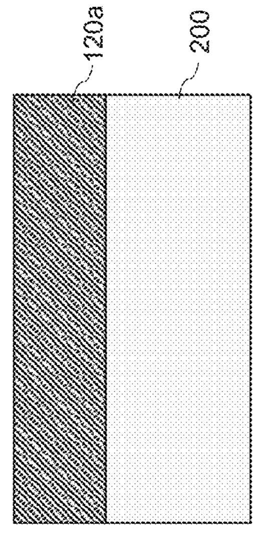
FIG. 2A illustrates an intermediate structure after formation of a bottom Low Thermal Conductivity (LTC) metal, according to one or more embodiments.

FIGS. 2A-2I illustrate sequential operations of a method of forming a selector structure 100, according to one or more embodiments. In particular, FIG. 2A illustrates an intermediate structure after formation of the bottom LTC metal 120*a*, according to one or more embodiments. The bottom LTC metal 120*a* may include one or more metals or metal materials having a high electrical conductivity, such as copper, gold, silver, aluminum, tungsten, nickel, platinum and tungsten nitride. The bottom LTC metal 120*a* may be formed on a substrate 200 for processing. The bottom LTC metal 120*a* may be deposited by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD). The thickness of the bottom LTC metal 120*a* may be in a range from about 1 nm to about 500 nm, although greater or lesser thicknesses may be used.

FIG. 2B illustrates an intermediate structure after forming an opening O1 in the bottom LTC metal 120*a*, according to one or more embodiments. The bottom LTC metal 120*a* may be etched so as to form the opening O1 in the bottom LTC metal 120*a*. The etching may be performed, for example, by a photolithographic process. The photolithographic process may include forming a patterned photoresist mask (not shown) on the bottom LTC metal 120*a*, and etching (e.g., wet etching, dry etching, etc.) the exposed upper surface through openings in the photoresist mask. The photoresist mask may be subsequently removed by ashing, dissolving the photoresist mask or by consuming the photoresist mask during the etch process.

Figure 2C:
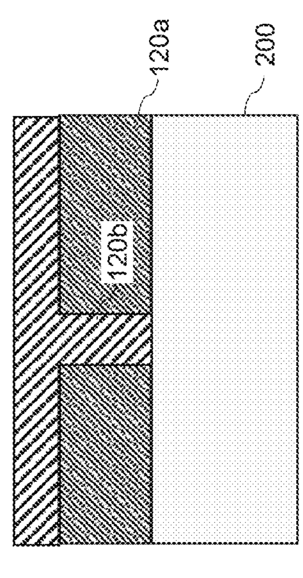
FIG. 2C illustrates an intermediate structure after forming the first bottom High Thermal Conductivity (HTC) metal, according to one or more embodiments.

FIG. 2C illustrates an intermediate structure after forming the first bottom HTC metal 120*b*, according to one or more embodiments. The first bottom HTC metal 120*b* may be for formed so as to fill the opening O1. The first bottom HTC metal 120*b* may include one or more metals or metal materials having a high electrical conductivity, such as copper, gold, silver, aluminum, tungsten, nickel, platinum and tungsten nitride. The first bottom HTC metal 120*b* may be deposited by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

FIG. 2D illustrates an intermediate structure after planarizing the bottom LTC metal 120*a* and the first bottom HTC metal 120*b*, according to one or more embodiments. An upper surface of the bottom LTC metal 120*a* and an upper surface of the first bottom HTC metal 120*b* may be planarized, for example, by chemical mechanical polishing (CMP), or other suitable planarization processes.

Figures 2E, 2F, 2G:
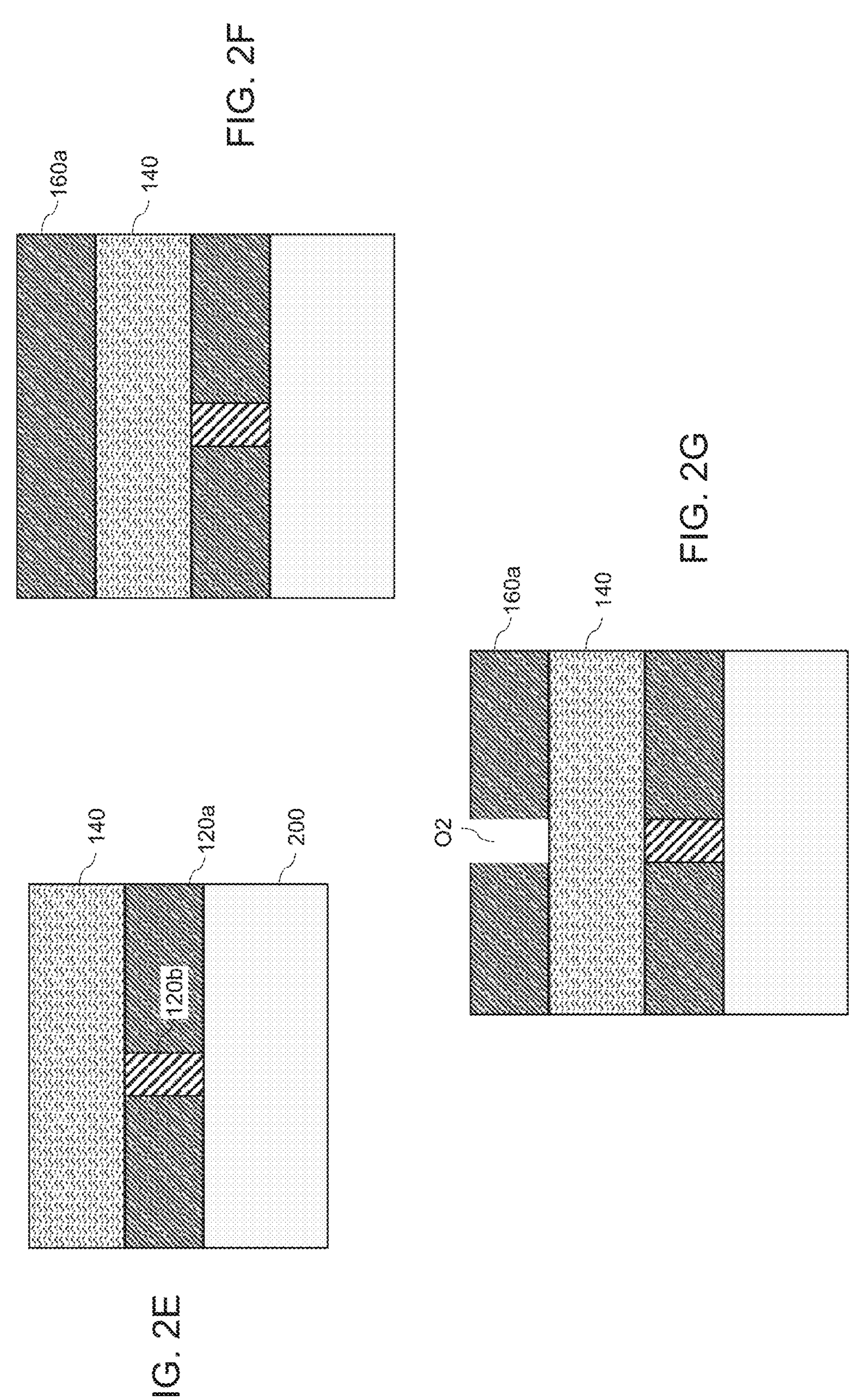
FIG. 2E illustrates an intermediate structure after forming a first switching film, according to one or more embodiments.
FIG. 2F illustrates an intermediate structure after forming a first top LTC metal, according to one or more embodiments.
FIG. 2G illustrates an intermediate structure after forming an opening in the first top LTC metal, according to one or more embodiments.

FIG. 2E illustrates an intermediate structure after forming the first switching film 140, according to one or more embodiments. The first switching film 140 may include a film having an electrical resistivity switchable by an electric field, such as an OTS-based film including one or more of selenium, tellurium and germanium. The first switching film 140 may be formed, for example, by deposition such as chemical vapor deposition (CVD), plasma-enhanced CVD (PECVD), low pressure chemical vapor deposition (LPCVD), physical vapor deposition (PVD) or atomic layer deposition (ALD). The first switching film 140 (e.g., OTS-based film) may be deposited to have a thickness in a range of about 5 nm to about 50 nm, although greater or lesser thicknesses may be used.

After the first switching film 140 is deposited, dopants may be optionally implanted in the first switching film 140 by a suitable implantation process, in order to manipulate a characteristic of the first switching film 140. Such dopants may include, for example, one or more of As, Si, Sb, N, C and B.

FIG. 2F illustrates an intermediate structure after forming the first top LTC metal 160*a*, according to one or more embodiments. Similarly to the bottom LTC metal 120*a*, the first top LTC metal 160*a* may include one or more metals or metal materials having a high electrical conductivity, such as copper, gold, silver, aluminum, tungsten, nickel, platinum and tungsten nitride. The first top LTC metal 160*a* may be deposition such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD). The thickness of the top LTC metal 160*a* may be in a range from about 1 nm to about 500 nm, although greater or lesser thicknesses may be used.

FIG. 2G illustrates an intermediate structure after forming an opening O2 in the first top LTC metal 160*a*, according to one or more embodiments. The first top LTC metal 160*a* may be etched so as to form the opening O2 in the first top LTC metal 160*a*. The etching may be performed, for example, by a photolithographic process. The photolithographic process may include forming a patterned photoresist mask (not shown), and etching (e.g., wet etching, dry etching, etc.) the exposed upper surface through openings in the photoresist mask. The photoresist mask may be subsequently removed by ashing, dissolving the photoresist mask or by consuming the photoresist mask during the etch process.

Figure 2I:
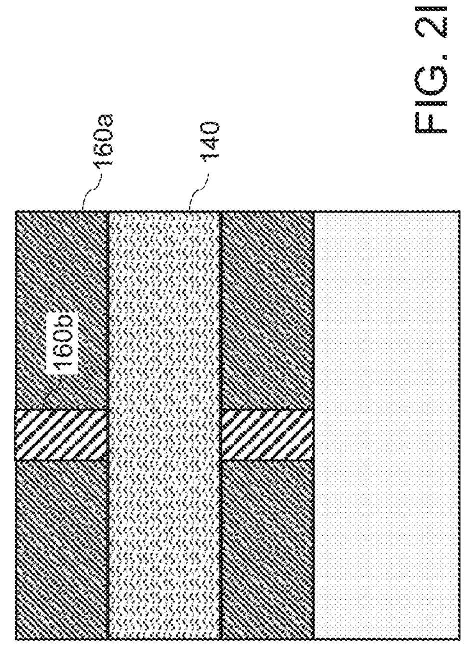
FIG. 2I illustrates an intermediate structure after planarizing the first top LTC metal and the first top HTC metal, according to one or more embodiments.
Figure 2H:
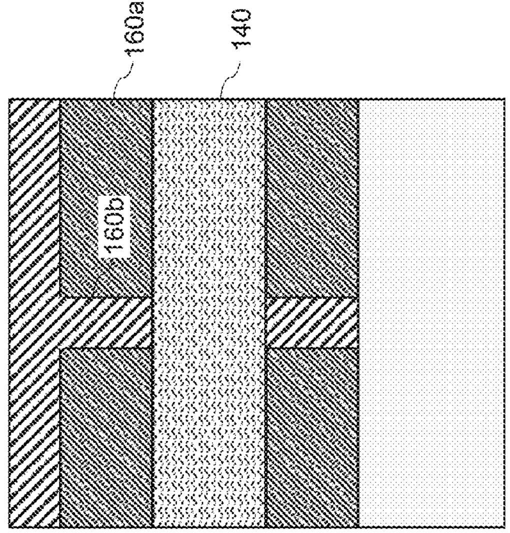
FIG. 2H illustrates an intermediate structure after forming the first top HTC metal, according to one or more embodiments.

FIG. 2H illustrates an intermediate structure after forming the first top HTC metal 160*b*, according to one or more embodiments. The first top HTC metal 160*b* may be formed so as to fill the opening O2. The first top HTC metal 160*b* may include one or more metals or metal materials having a high electrical conductivity, such as copper, gold, silver, aluminum, tungsten, nickel, platinum and tungsten nitride. The first top HTC metal 160*b* may be deposited by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

FIG. 2I illustrates an intermediate structure after planarizing the first top LTC metal 160*a* and the first top HTC metal 160*b*, according to one or more embodiments. An upper surface of the first top LTC metal 160*a* and an upper surface of the first top HTC metal 160*b* may be planarized, for example, by chemical mechanical polishing (CMP), or other suitable planarization processes.

Figure 3:
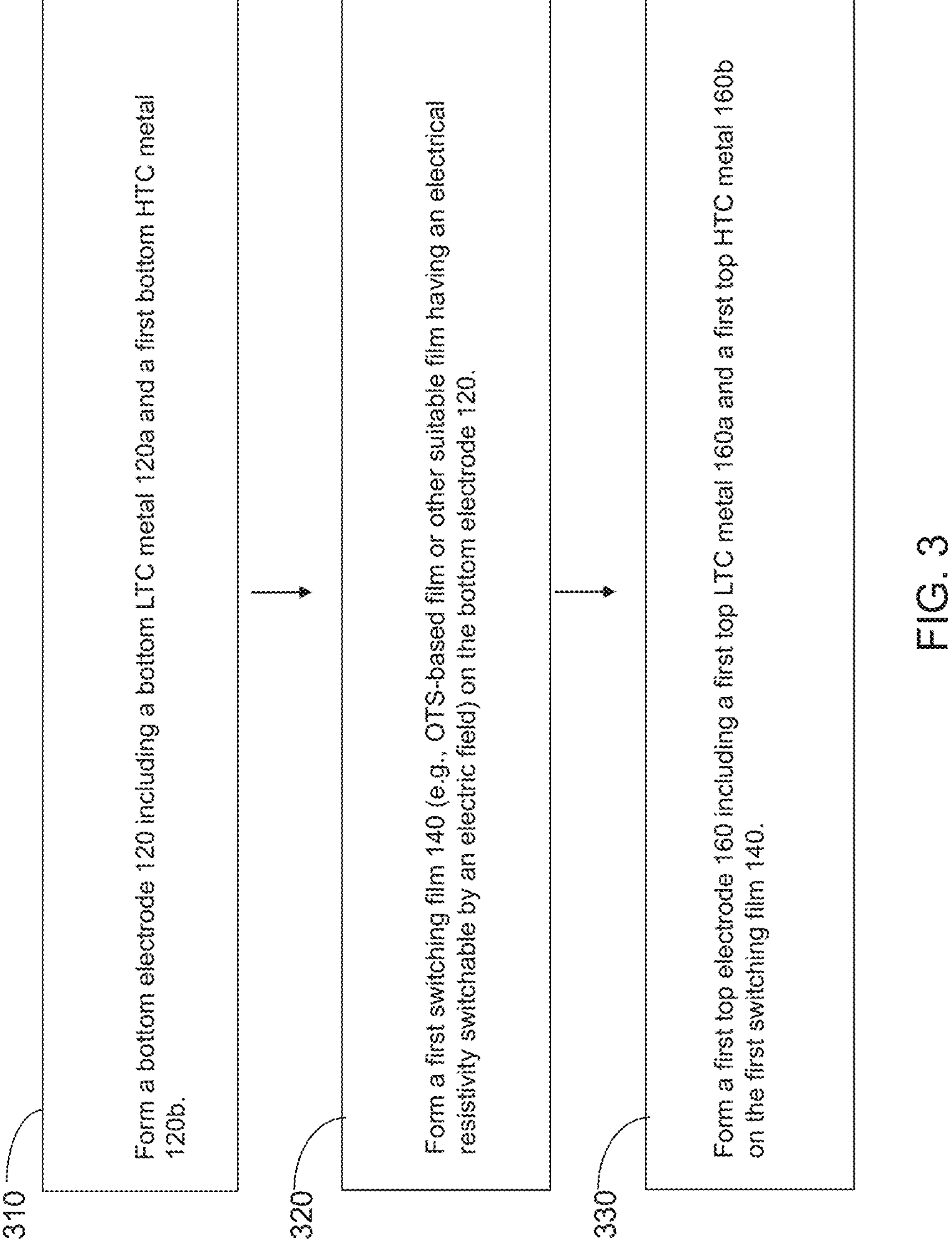
FIG. 3 is a flow chart illustrating various steps of a method of forming the selector structure, according to one or more embodiments.

FIG. 3 is a flow chart illustrating the steps of an embodiment method of forming the selector structure 100, according to one or more embodiments. The method of forming the selector structure 100 may include step 310, forming a bottom electrode 120 including a bottom LTC metal 120*a* and a first bottom HTC metal 120*b*. The method may also include step 320, forming a first switching film 140 (e.g., OTS-based film or other suitable film having an electrical resistivity switchable by an electric field) on the bottom electrode 120. The method may also include step 330, forming a first top electrode 160 including a first top LTC metal 160*a* and a first top HTC metal 160*b* on the first switching film 140.

Figure 4:
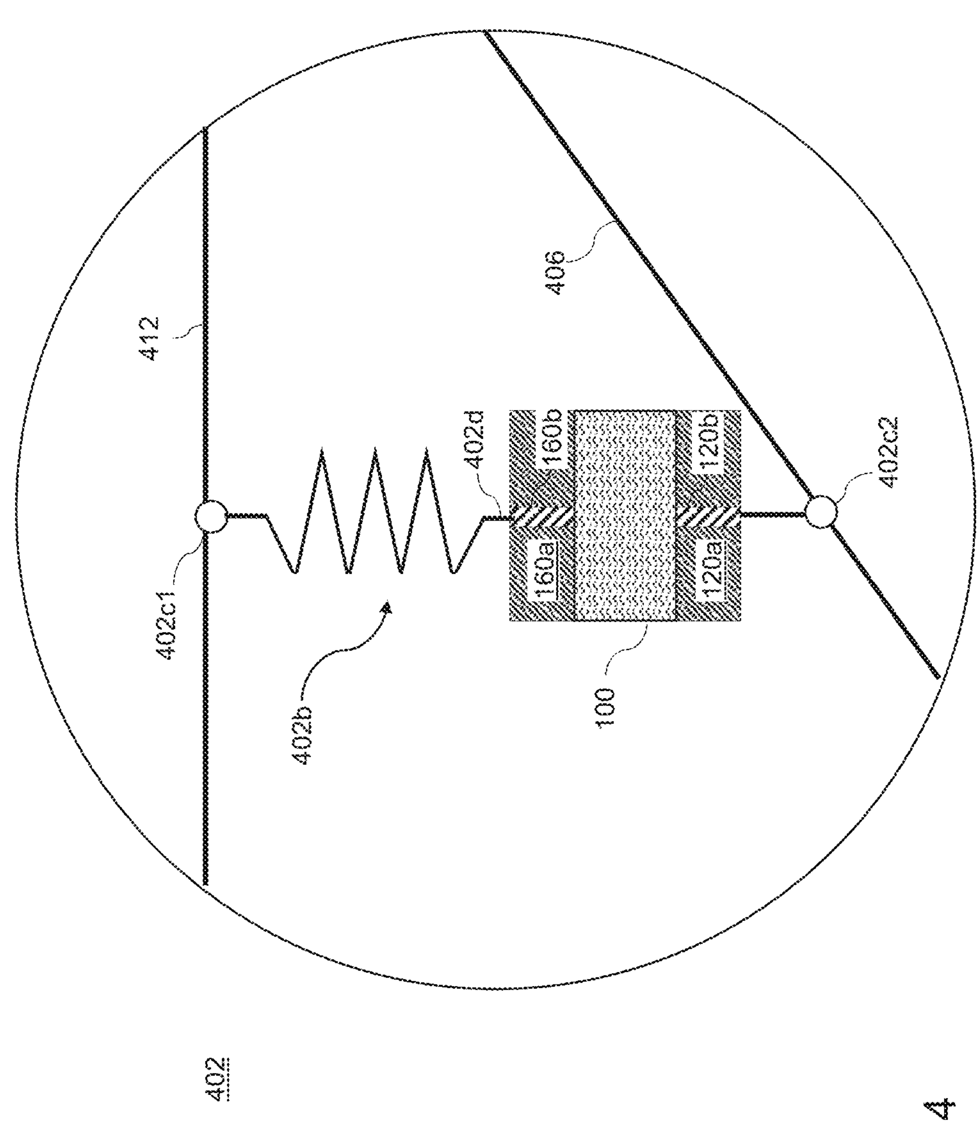
FIG. 4 is a schematic diagram of a memory cell of a memory array, according to one or more embodiments.

FIG. 4 is a schematic diagram of a memory cell 402 of a memory array, according to one or more embodiments. As illustrated in FIG. 4, the memory cell 402 may include an embodiment selector structure 100 and resistive element 402*b* arranged in series between a word line 406 and bit line 412.

The memory cell 402 may also include a first terminal 402*c*1 for connecting (e.g., coupling) the memory cell 402 to the bit line 412. In particular, the first terminal 402*c*1 may connect the resistive element 402*b* to the bit line 412. The memory cell 402 may also include a second terminal 402*c*2 for connecting the memory cell 402 to the word line 406. In particular, the second terminal 402*c*2 may connect the selector structure 100 to the word line 406.

As illustrated in FIG. 4, an electrical connection may be made to the selector structure 100 at the first bottom HTC metal 120*b* and the first top HTC metal 160*b*. The electrical connection may alternatively be made at the bottom LTC metal 120*a* and the first top LTC metal 160*a*.

The memory cell 402 may also include a connection line 402*d* that electrically connects the selector structure 100 to the resistive element 402*b*. The connection line 402*d* may include, for example a metal line or metal trace. In at least one embodiment, the connection line 402*d* may be omitted so that the selector structure 100 and the resistive element 402*b* are in direct physical contact. The memory cell 402 may also include other connection lines for connecting the memory cell 402 to the word line 406 and the bit line 412. It should be noted that a connection of the memory cell 402 to the word line 406 and a connection of the memory cell 402 to the bit line 412 do not necessarily require a direct connection.

The selector structure 100 may have a threshold voltage that is initially at a first threshold value, and that can be decreased to a second threshold value. The resistive element 402*b* may have a variable resistance. The resistive element 402*b* may include, for example, a non-volatile memory (NVM) element. The resistive element 402*b* may include, for example, PCRAM data storage material, RRAM data storage material, FeRAM) data storage material or CBRAM data storage material.

The selector structure 100 may cooperate with the resistive element 402*b* to store data in the memory cell 402. The selector structure 100 may inhibit (e.g., prevent) generation of a leakage current when the memory cell 402 is not selected. Each memory cell 402 in the memory array may be initially in a logic "0" state, and can be switched to a logic "1" state by performing a write operation thereon.

Figure 5:
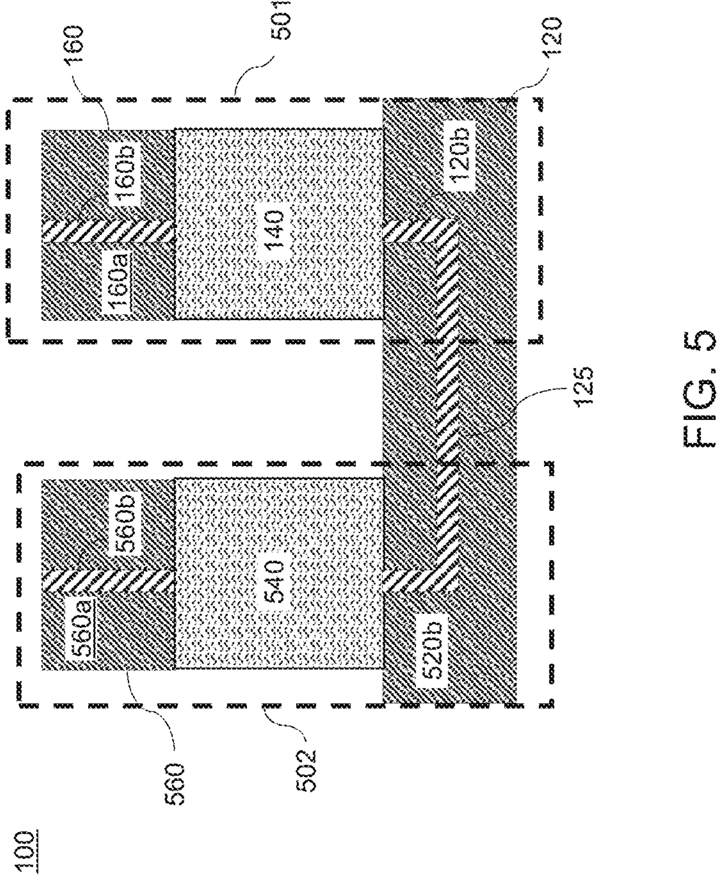
FIG. 5 illustrates an alternative design of the selector structure, according to one or more embodiments.

FIG. 5 illustrates an alternative design of the selector structure 100, according to one or more embodiments. As illustrated the alternative design of FIG. 5, the selector structure 100 may include a first selector 501 and a second selector 502 which have a common bottom electrode 120. The bottom electrode 120 of the selector structure 100 in this alternative design may provide an effective area for a memory array application. In particular, the alternative design may be especially suited for a low power memory array application.

In particular, the first selector 501 may include the bottom electrode 120 that has a first bottom HTC metal 120*b* that is included in the bottom electrode 120, the first switching film 140, and the first top electrode 160. The second selector 502 may include the bottom electrode 120 and a second bottom HTC metal 520*b* that is included in the bottom electrode 120. The second bottom HTC metal 520*b* may be substantially the same as the first bottom HTC metal 120*b*.

The second selector 502 may also include a second switching film 540 on the bottom electrode 120. The second switching film 540 may be substantially the same as the first switching film 140. The second selector 502 may also include a second top electrode 560 on the second switching film 540. The second top electrode 560 may include a second top LTC metal 560*a* (similar to the first top LTC metal 160*a*) and a second top HTC metal 560*b* (similar to the first top HTC metal 160*b*).

As illustrated in FIG. 5, the second bottom HTC metal 520*b* may be substantially aligned with the second top HTC metal 560*b* in the thickness direction. In addition, the first bottom HTC metal 120*b* may be electrically coupled to the second bottom HTC metal 520*b* via an HTC coupling line 125. The HTC coupling line 125 may have substantially same structure (e.g., material composition, thickness, etc.) as the first bottom HTC metal 120*b* and the second bottom HTC metal 520*b*.

Figure 6:
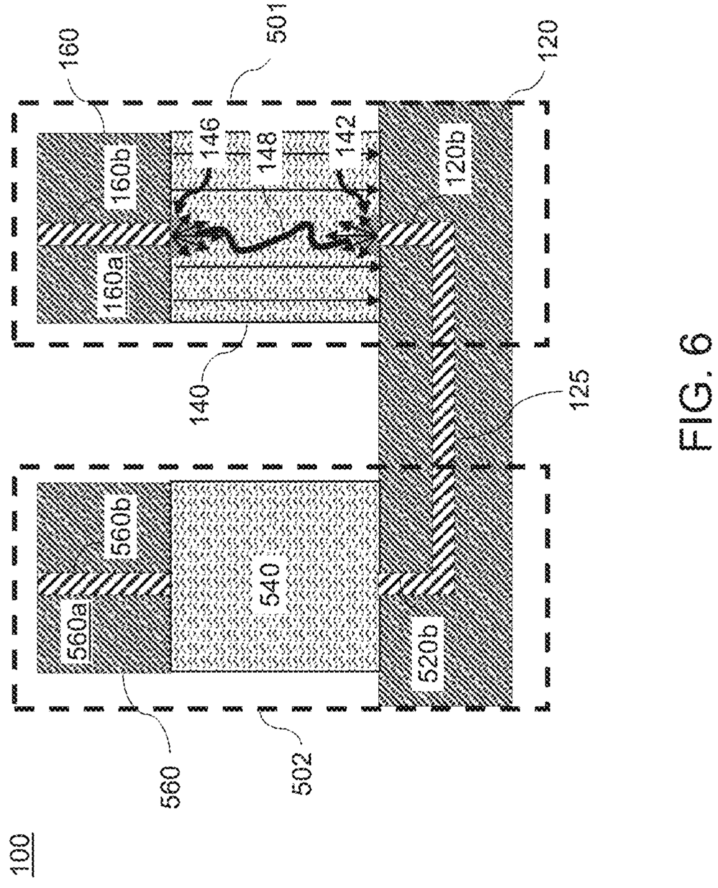
FIG. 6 illustrates an operation of the alternative design of the selector structure in FIG. 5, according to one or more embodiments.

FIG. 6 illustrates an operation of the alternative design of the selector structure 100 in FIG. 5, according to one or more embodiments. A characteristic (e.g., operating characteristic) of the alternative design may be consistent with a selector structure 100 having a bottom electrode 120 with a basic configuration in FIG. 1A.

With the alternative design, the bottom electrode 120 may be conveniently coupled to a word line of a memory array. The first selector 501 may be included in a first memory cell (not shown) of a memory array and coupled to first bit line in the memory array. The second selector 502 may be included in a second memory cell (not shown) of the memory array and coupled to a second bit line in the memory array.

In the memory array, the alternative design may provide a common word line for the first memory cell including the first selector 501 and the second memory cell including the second selector 502. Each of the first memory cell and second memory cell can be operated independently. The alternative design may allow for a reduction of total area of the memory array.

As illustrated in FIG. 6, in an operation of the alternative design, the first selector 501 (in the first memory cell) may be selected and the second selector 502 (in the second memory cell) may be unselected. In this case, a sufficient voltage may be applied across between the first top electrode 160 and bottom electrode 120, so as to generate an electric field for switching the switching film 140. The first bottom HTC metal 120*b* may generate the bottom thermal energy 142 in the switching film 140, and the first top HTC metal 160*b* may generate the top thermal energy 146 in the switching film 140. As a result, the localized filament 148 of conductive atoms may be formed locally in close proximity to the first bottom HTC metal 120*b* and the first top HTC metal 160*b*.

Figure 7:
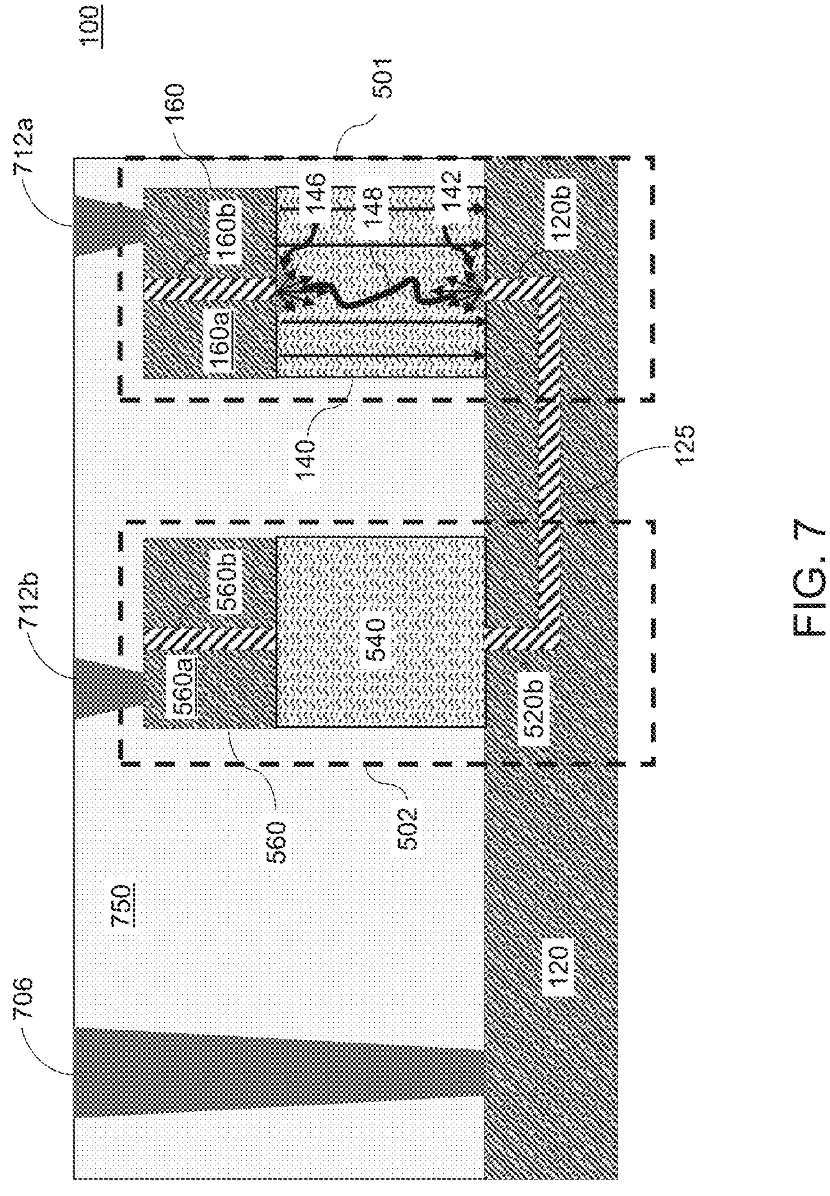
FIG. 7 illustrates an implementation for a memory array of the alternative design of the selector structure in FIG. 5, according to one or more embodiments.

FIG. 7 illustrates an implementation for a memory array of the alternative design of the selector structure 100 in FIG. 5, according to one or more embodiments. As illustrated in FIG. 7, the bottom electrode 120 may have an extended configuration. The extended configuration may allow a word line 706 of a memory array to be conveniently formed on an upper surface of the bottom electrode 120. In particular, as illustrated in FIG. 7, the word line 706 may contact the same upper surface of the bottom electrode 120 on which the first switching film 140 and second switching film 540 are formed.

Thus, the word line 706 may be common to both a first memory cell (not shown) including the first selector 501 and a second memory cell (not shown) including the second selector 502. In addition, a first bit line 712*a* may be connected to the first top electrode 160 in the first memory cell, and a second bit line 712*b* may be connected to the second top electrode 560 in the second memory cell. Although it is not illustrated in FIG. 7, the first bit line 712*a* may be connected to the first top electrode 160 via a resistive element (e.g., non-volatile memory (NVM)) of the first memory cell (e.g., see FIG. 4), and the second bit line 712*b* may be connected to the second top electrode 560 via a resistive element (e.g., NVM) in the second memory cell.

As further illustrated in FIG. 7, a dielectric layer 750 (e.g., interlayer dielectric) may be located on the bottom electrode 120. Other elements of the first selector 501 (e.g., first switching film 140 and first top electrode 160) and second selector 502 (e.g., second switching film 540 and second top electrode 560) may be formed in the dielectric layer 750 (e.g., one or more dielectric layers). The word line 706, first bit line 712*a* and second bit line 712*b* may also be formed in the dielectric layer 750.

Figure 8B:
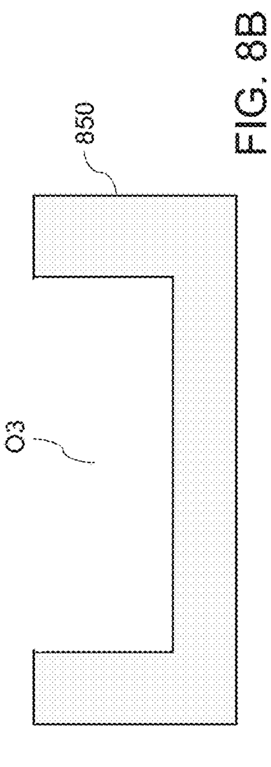
FIG. 8B illustrates an intermediate structure after forming an opening in the first dielectric layer, according to one or more embodiments.
Figure 8D:
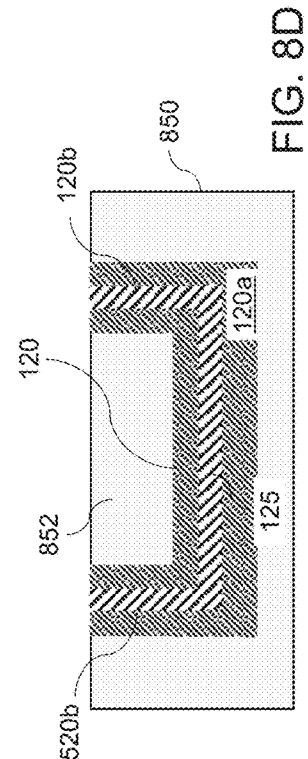
FIG. 8D illustrates an intermediate structure after performing planarization, according to one or more embodiments.
Figure 8A:
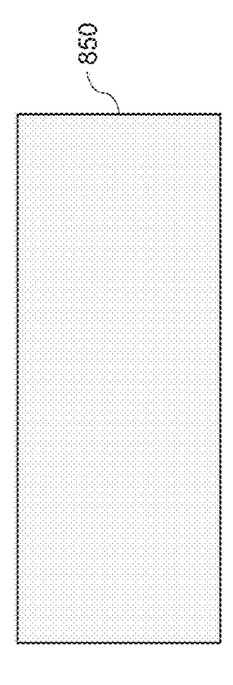
FIG. 8A illustrates an intermediate structure after formation of a first dielectric layer, according to one or more embodiments.

FIGS. 8A-8I illustrate sequential operations of a method of forming a selector structure 100 having the alternative design of FIG. 5, according to one or more embodiments. In particular, FIG. 8A illustrates an intermediate structure after formation of a first dielectric layer 850, according to one or more embodiments. The first dielectric layer 850 may include any suitable dielectric material (e.g., $SiO_2$). The first dielectric layer 850 may be formed, for example, by any suitable means of deposition, such as chemical vapor deposition (CVD), plasma-enhanced CVD (PECVD), low pressure chemical vapor deposition (LPCVD), physical vapor deposition (PVD) or atomic layer deposition (ALD).

FIG. 8B illustrates an intermediate structure after forming an opening O3 in the first dielectric layer 850, according to one or more embodiments. The first dielectric layer 850 may be etched so as to form the opening O3 in the first dielectric layer 850. The etching may be performed, for example, by a photolithographic process. The photolithographic process may include forming a patterned photoresist mask (not shown) on the first dielectric layer 850, and etching (e.g., wet etching, dry etching, etc.) the exposed upper surface through openings in the photoresist mask. The photoresist mask may be subsequently removed by ashing, dissolving the photoresist mask or by consuming the photoresist mask during the etch process.

Figure 8C:
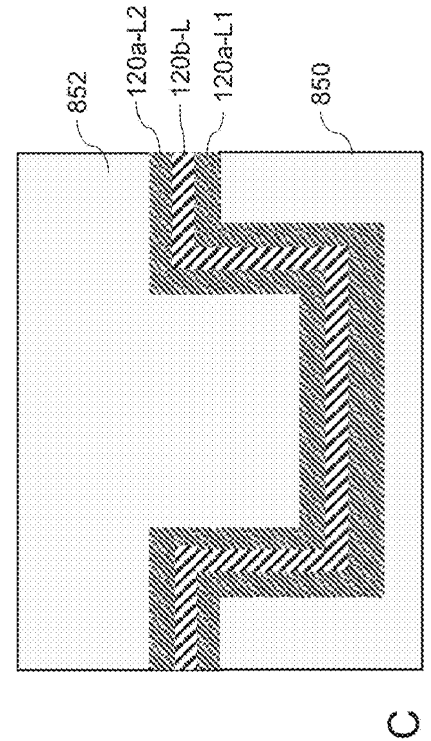
FIG. 8C illustrates an intermediate structure after forming metallization for the bottom electrode, according to one or more embodiments.

FIG. 8C illustrates an intermediate structure after forming metallization for the bottom electrode 120, according to one or more embodiments. As illustrated in FIG. 8C, the metallization may include a first LTC metal layer 120*a*-L1, an HTC metal layer 120*b*-L and a second LTC metal layer 120*a*-L2. The first LTC metal layer 120*a*-L1, HTC metal layer 120*b*-L and second LTC metal layer 120*a*-L2 may be sequentially formed and conformally formed in the opening O3 and on an upper surface of the first dielectric layer 850. A total thickness of the metallization may be in a range from about 1 nm to 500 nm. Each of the first LTC metal layer 120*a*-L1, HTC metal layer 120*b*-L and second LTC metal layer 120*a*-L2 may be formed, for example, by any suitable means of deposition, such as chemical vapor deposition (CVD), plasma-enhanced CVD (PECVD), low pressure chemical vapor deposition (LPCVD), physical vapor deposition (PVD) (e.g., sputtering) or atomic layer deposition (ALD).

A second dielectric layer 852 may be formed, on the second LTC metal layer 120*a*-L2. The second dielectric layer 852 may be formed of the same material as the first dielectric layer 850, or another suitable dielectric material. The second dielectric layer 852 may be formed for example, by any suitable means of deposition, such as chemical vapor deposition (CVD), plasma-enhanced CVD (PECVD), low pressure chemical vapor deposition (LPCVD), physical vapor deposition (PVD) or atomic layer deposition (ALD).

FIG. 8D illustrates an intermediate structure after performing planarization, according to one or more embodiments. As illustrated in FIG. 8D, the planarization may be performed so as to remove the metallization that was formed outside the opening O3. As a result, a uniform upper surface of the metallization including the first LTC metal layer 120*a*-L1, HTC metal layer 120*b*-L and second LTC metal layer 120*a*-L2 may be formed. The uniform upper surface of the metallization may also be made coplanar with an upper surface of the first dielectric layer 850 and second dielectric layer 852. The planarization step in FIG. 8D may complete the formation of the bottom electrode 120 including the bottom LTC metal 120*a*, the first bottom HTC metal 120*b*, the second bottom HTC metal 520*b* and the HTC coupling line 125. The planarization may be performed, for example, by chemical mechanical polishing (CMP), or other suitable planarization processes.

FIG. 8E illustrates an intermediate structure after forming of a switching film layer 140-L, according to one or more embodiments. The switching film layer 140-L may include, for example, an OTS-based film including one or more of Se, Te or Ge. The switching film layer 140-L may be formed to have a thickness from about 5 nm to about 50 nm. The switching film layer 140-L may be formed on the planarized surface of the bottom electrode 120, the first dielectric layer 850 and second dielectric layer 852. The switching film layer 140-L may be formed, for example, by any suitable means of deposition, such as chemical vapor deposition (CVD), plasma-enhanced CVD (PECVD), low pressure chemical vapor deposition (LPCVD), physical vapor deposition (PVD) (e.g., sputtering) or atomic layer deposition (ALD).

FIG. 8F illustrates an intermediate structure after forming an opening O4 in the switching film layer 140-L, according to one or more embodiments. The switching film layer 140-L may be etched so as to form the opening O4 in the switching film layer 140-L and expose an upper surface of the second dielectric layer 852. The etching may complete the formation of the first switching film 140 and the second switching film 540. The etching may be performed, for example, by a photolithographic process. The photolithographic process may include forming a patterned photoresist mask (not shown) on the switching film layer 140-L, and etching (e.g., wet etching, dry etching, etc.) the exposed upper surface through openings in the photoresist mask. The photoresist mask may be subsequently removed by ashing, dissolving the photoresist mask or by consuming the photoresist mask during the etch process.

FIG. 8G illustrates an intermediate structure after forming a third dielectric layer 853, according to one or more embodiments. The third dielectric layer 853 may be formed in the opening O4 and on the upper surface of the second dielectric layer 852. The third dielectric layer 853 may also be formed on the first switching film 140 and second switching film 540. The third dielectric layer 853 may be formed of the same material as the first dielectric layer 850 and second dielectric layer 852, or another suitable dielectric material. The third dielectric layer 853 may be formed for example, by any suitable means of deposition, such as chemical vapor deposition (CVD), plasma-enhanced CVD (PECVD), low pressure chemical vapor deposition (LPCVD), physical vapor deposition (PVD) or atomic layer deposition (ALD).

Figure 8I:
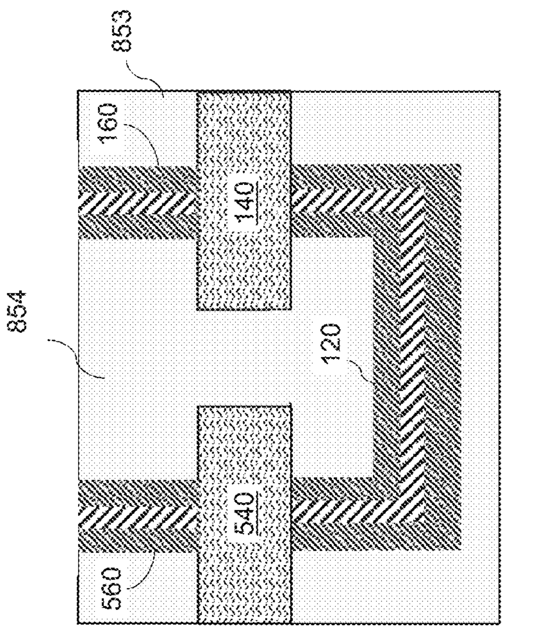
FIG. 8I illustrates an intermediate structure after forming the first top electrode and the second top electrode, according to one or more embodiments.
Figure 8H:
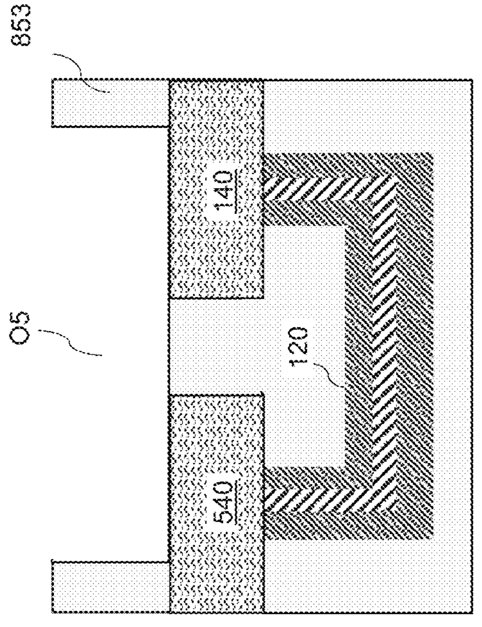
FIG. 8H illustrates an intermediate structure after forming an opening in the third dielectric layer, according to one or more embodiments.

FIG. 8H illustrates an intermediate structure after forming an opening O5 in the third dielectric layer 853, according to one or more embodiments. The third dielectric layer 853 may be etched so as to form the opening O5 in the third dielectric layer 853, and expose an upper surface of the first switching film 140 and an upper surface of the second switching film 540. The etching may be performed, for example, by a photolithographic process. The photolithographic process may include forming a patterned photoresist mask (not shown) on the third dielectric layer 853, and etching (e.g., wet etching, dry etching, etc.) the exposed upper surface through openings in the photoresist mask. The photoresist mask may be subsequently removed by ashing, dissolving the photoresist mask or by consuming the photoresist mask during the etch process.

FIG. 8I illustrates an exemplary intermediate structure after forming the first top electrode 160 and the second top electrode 560, according to one or more embodiments. In particular, the first top electrode 160 may be formed on the first switching film 140 and the second top electrode 560 may be formed on the second switching film 540.

The first top electrode 160 and the second top electrode 560 may be formed in the opening O5 by a process similar to that illustrated above in FIGS. 8C and 8D. For example, metallization (e.g., LTC metal and HTC metal) for the first top electrode 160 and second top electrode 560 may be sequentially and conformally deposited in the opening O5. A fourth dielectric layer 854 may be formed, on the metallization, and planarization may be performed so as to remove the metallization that was formed outside the opening O5. As a result, a uniform upper surface of the metallization may be formed, and a forming of the first top electrode 160 and the second top electrode 560 may be completed.

Figure 9:
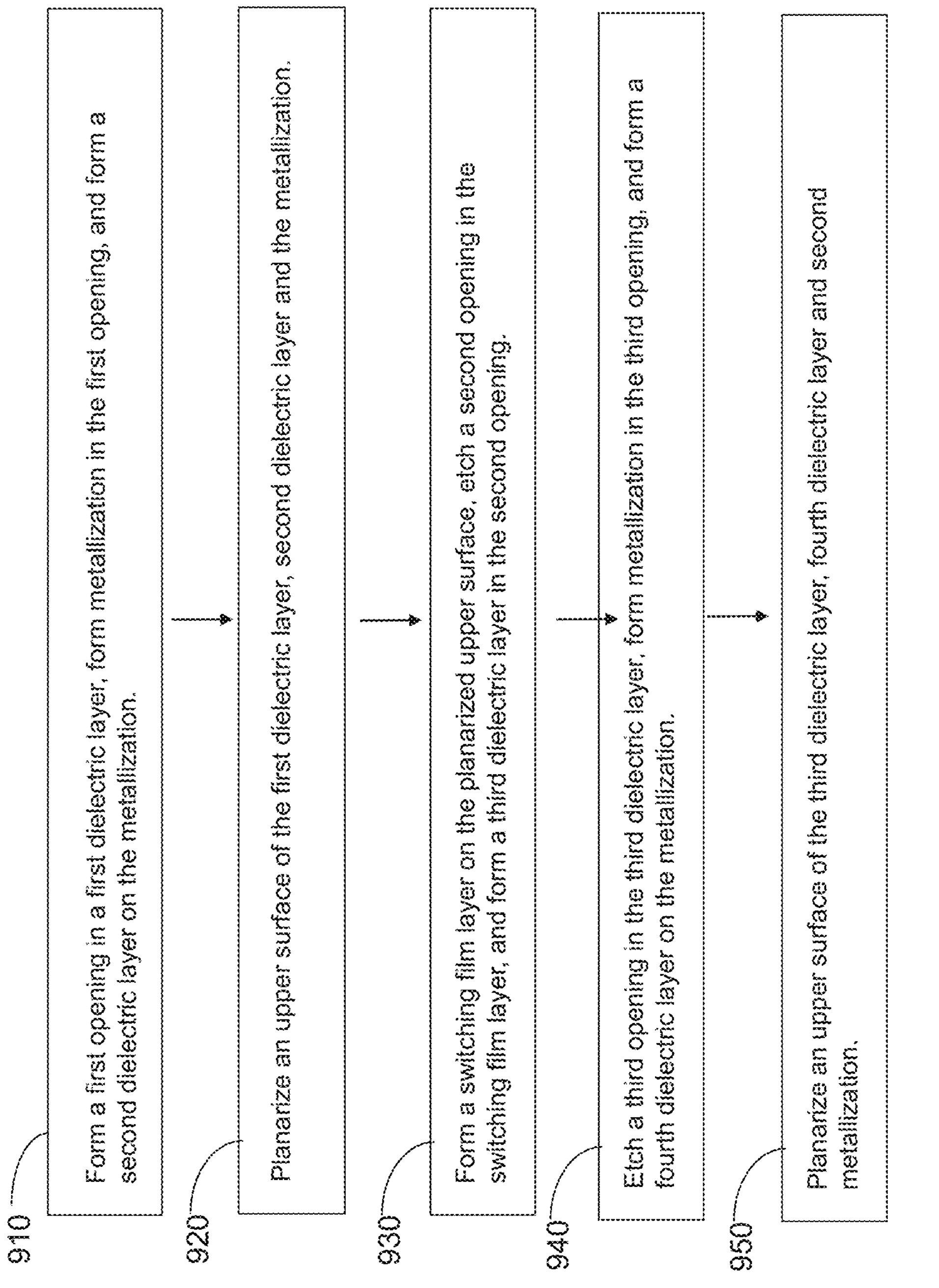
FIG. 9 is a flow chart illustrating various steps of a method of forming the selector structure having the alternative design of FIG. 5, according to one or more embodiments.

FIG. 9 is a flowchart illustrating the steps of a method of forming the selector structure 100 having the alternative design of FIG. 5, according to one or more embodiments. The embodiment method of forming the selector structure 100 with the alternative design may include step 910, forming a first opening in a first dielectric layer, forming metallization in the first opening, and forming a second dielectric layer on the metallization. The embodiment method may also include step 920, planarizing an upper surface of the first dielectric layer, second dielectric layer and the metallization. The embodiment method may also include step 930, forming a switching film layer on the planarized upper surface, etching a second opening in the switching film layer, and forming a third dielectric layer in the second opening. The embodiment method may also include step 940, etching a third opening in the third dielectric layer, forming metallization in the third opening, and forming a fourth dielectric layer on the metallization. The embodiment method may also include step 950, planarizing an upper surface of the third dielectric layer, fourth dielectric layer and second metallization.

Figure 10:
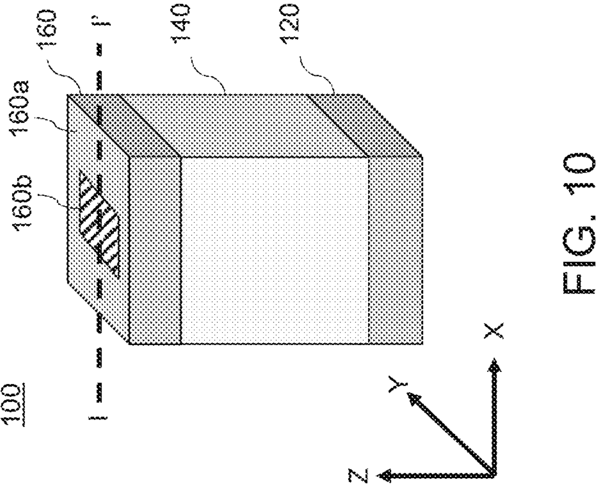
FIG. 10 is a perspective view of the selector structure having a basic configuration, according to one or more embodiments.

FIG. 10 is a perspective view of the selector structure 100 having a basic configuration, according to one or more embodiments. The cross-sectional view in FIG. 1A may be a view of a cross-section of the selector structure 100 along lines I-I' in FIG. 10.

As illustrated in FIG. 10, the selector structure 100 may have a square cylinder shape (e.g., cuboid). In particular, each of the bottom electrode 120, first switching film 140 and first top electrode 160 may have a square cylinder shape. The first top HTC metal **160*b* and first bottom HTC metal 120*b* (not shown) may also have a square cylinder shape. The first top LTC metal 160*a* may have a square annular ring shape that substantially surrounds the first top HTC metal 160*b***.

Figure 11:
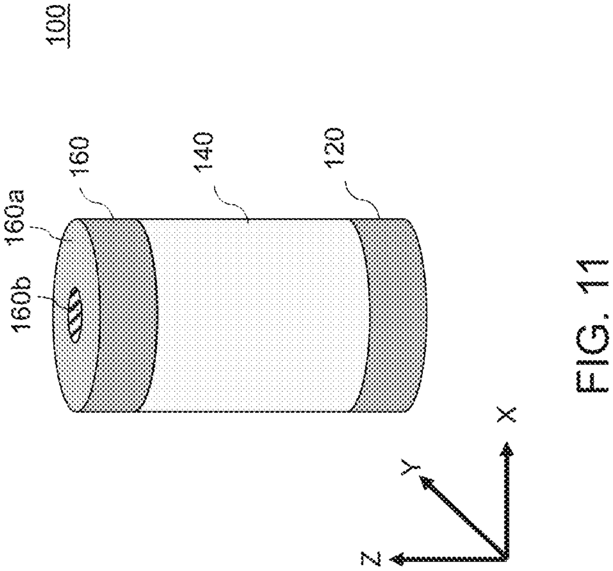
FIG. 11 is a perspective view of the selector structure having a basic configuration (e.g., see FIG. 1A) with an alternative design, according to one or more embodiments.

FIG. 11 is a perspective view of the selector structure 100 having a basic configuration (e.g., see FIG. 1A) with an alternative design, according to one or more embodiments. As illustrated in FIG. 11, the selector structure 100 may have a circular cylinder shape. In particular, each of the bottom electrode 120, first switching film 140 and first top electrode 160 may have a circular cylinder shape. The first top HTC metal **160*b* and first bottom HTC metal 120*b* (not shown) may also have a circular cylinder shape. The first top LTC metal 160*a* may have an annular ring shape that substantially surrounds the first top HTC metal 160*b***.

In each of FIGS. 10 and 11, a shape of the selector structure 100 may remain substantially the same along a z-direction. That is, a shape of a cross-section of the selector structure 100 in the x-y plane may be uniform along the length of the selector structure 100 in the z-direction. Further, a contact area ratio of the bottom LTC metal **120*a* to first bottom HTC metal 120*b*, and a contact area ratio of the first top LTC metal 160*a* to first top HTC metal 160*b* in the selector structure 100 may each be designed to be proportional to electrical conductivity of the HTC metal and LTC metal used in the selector structure 100**. For example, where the HTC metal is copper and the LTC metal is tungsten, the contact area ratio (LTC metal:HTC metal) may be in a range from about 8 to 13. Where the HTC metal is copper and the LTC metal is aluminum, the contact area ratio (LTC metal:HTC metal) may be in a range from about 1 to 5. Where the HTC metal is aluminum and the LTC metal is tungsten, the contact area ratio (LTC metal:HTC metal) may be in a range from about 3 to 8.

Figure 12:
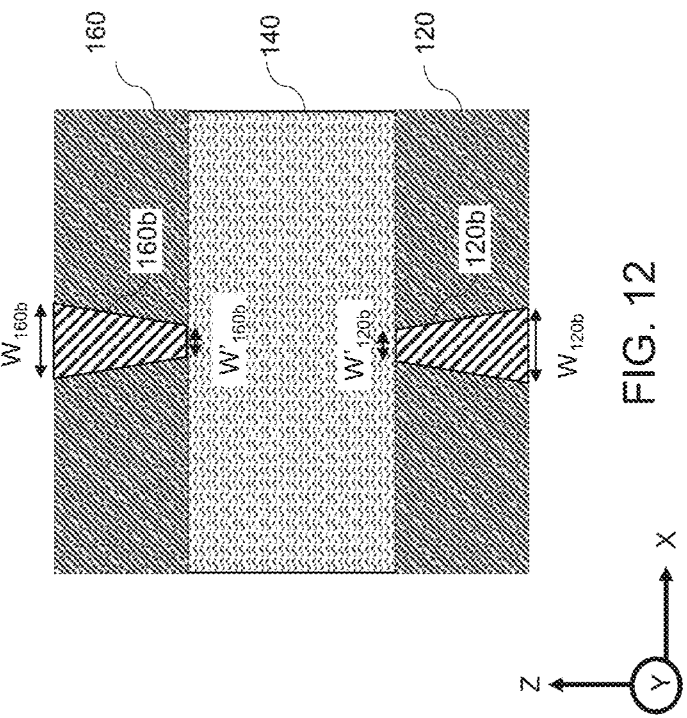
FIG. 12 is a cross-sectional view of the selector structure with an alternative HTC metal design, according to one or more embodiments.

FIG. 12 is a cross-sectional view of the selector structure 100 with an alternative HTC metal design, according to one or more embodiments. As illustrated in FIG. 12, the selector structure 100 includes a moderate difference in the width of the proximal end and distal end of the HTC metal (e.g., first top HTC metal 160*b* and first bottom HTC metal 120*b*). (Note that the terms "proximal" and "distal" here are used with reference to the first switching film 140). The inventors have discovered that a performance (e.g., efficiency) of the selector structure 100 may increase as this difference in the width of the HTC metal increases.

Thus, an efficiency of the selector structure 100 in FIG. 12 may be improved by having the width of the HTC metal decrease in a direction toward the first switching film 140. That is, a distal width $W_{120b}$ of the first bottom HTC metal 120*b* may be greater than a proximal width $W'_{120b}$ of the first bottom HTC metal 120*b*, and a distal width $W_{160b}$ of the first top HTC metal 160*b* may be greater than a proximal width $W'_{160b}$ of the first top HTC metal 160*b*. In one or more embodiments, the proximal width of the HTC metal may be about 10% to 70% of the distal width of the HTC metal.

Figure 13:
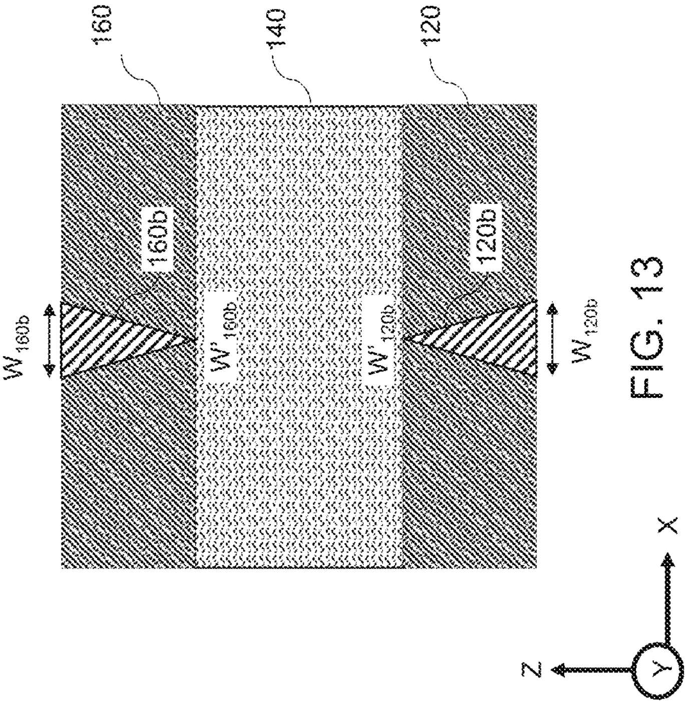
FIG. 13 is a cross-sectional view of the selector structure with a second alternative HTC metal design, according to one or more embodiments.

FIG. 13 is a cross-sectional view of the selector structure 100 with a second alternative HTC metal design, according to one or more embodiments. As illustrated in FIG. 13, the selector structure 100 includes a large difference in the width of the proximal end and distal end of the HTC metal (e.g., first top HTC metal 160*b* and first bottom HTC metal 120*b*). Since the width difference in the HTC metal in FIG. 13 is greater than that in FIG. 12, the selector structure 100 in FIG. 13 may have an even greater efficiency than the selector structure 100 of FIG. 12.

In the selector structure of FIG. 13, the proximal width of the HTC metal may be less than 10% of the distal width of the HTC metal. That is, the proximal width $W'_{120b}$ of the first bottom HTC metal 120*b* may be less than 10% of the distal width $W_{120b}$ of the first bottom HTC metal 120*b*, and the proximal width $W'_{160b}$ of the first top HTC metal 160*b* may be less than 10% of the distal width $W_{160b}$ of the first top HTC metal 160*b*. In one or more embodiments, the proximal width $W'_{120b}$ of the first bottom HTC metal 120*b* and the proximal width $W'_{160b}$ of the first top HTC metal 160*b* may each be approximately zero, which may optimize a performance of the selector structure 100.

It should be noted that for the selector structure in both FIG. 12 and FIG. 13, the width difference in the first bottom HTC metal 120*b* is not necessarily the same as the width difference in the first top HTC metal 160*b*. For example, a width difference in the first bottom HTC metal 120*b* may be about 50% but the width difference in the first top HTC metal 160*b* may be less than 10%.

Figure 14:
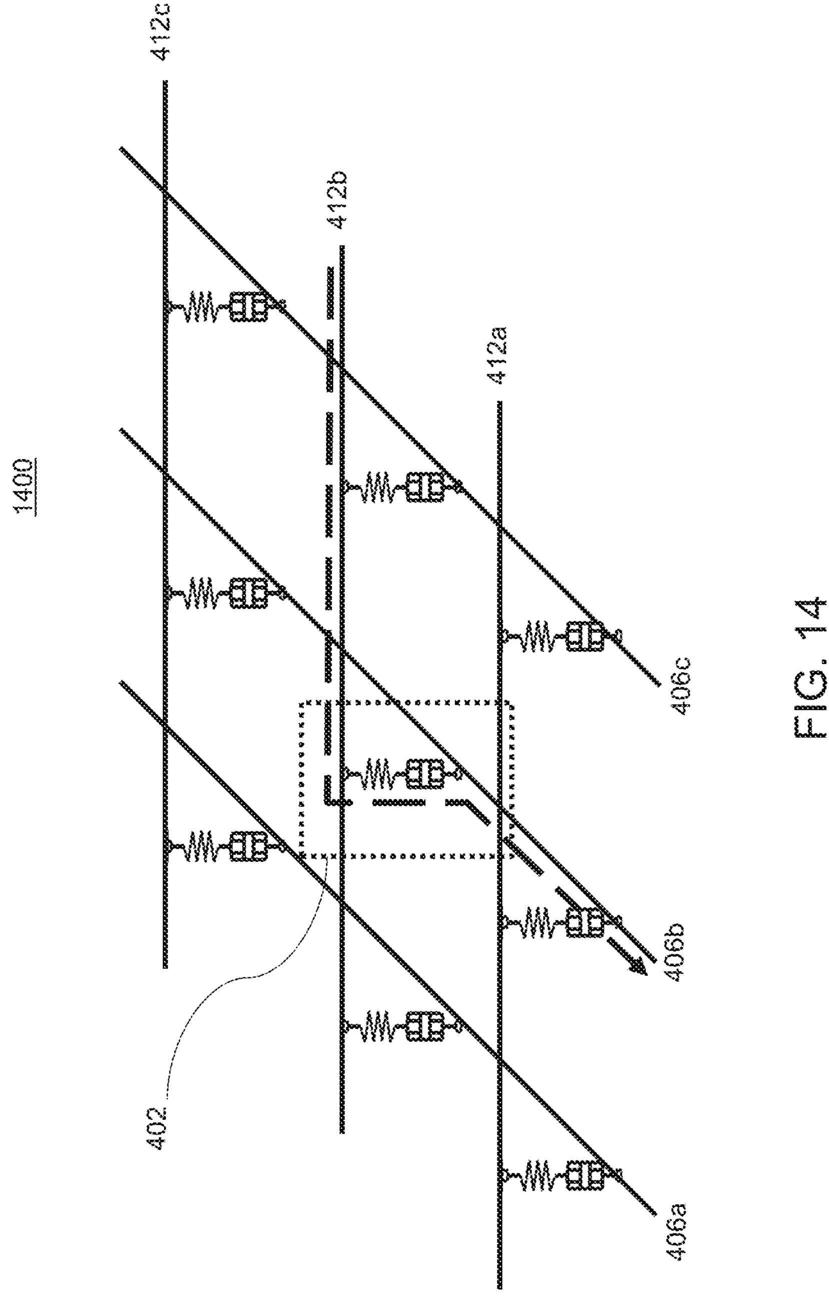
FIG. 14 is a schematic diagram of a memory array including a plurality of memory cells (e.g., see FIG. 4) that include the selector structure, according to one or more embodiments.

FIG. 14 is a schematic diagram of a memory array 1400 including a plurality of memory cells 402 (e.g., see FIG. 4) that include the selector structure 100, according to one or more embodiments. As illustrated in FIG. 14, the memory array 1400 may include a plurality of word lines 406*a*-406*c* and a plurality of bit lines 412*a*-412*c* intersecting the plurality of word lines 406*a*-406*c*. A memory cell 402 is formed at an intersection of a word line in the plurality of word lines 406*a*-406*c* and a bit line of the plurality of bit lines 412*a*-412*c*. The dashed line in FIG. 14 illustrates a selection of the memory cell 402 at the intersection of the word line 406*b* and the bit line 412*b*.

The selector structure 100 may provide the memory array 1400 with a reduced total power consumption as compared to the typical OTS selector. In performing a write operation, a typical OTS selector may use a voltage of $V_{write}$ to prevent operation failure due to high leakage current. However, the selector structure 100 may have a low leakage current and, therefore, may allow the memory array 1400 to use $V_{write}'$ which is less than $V_{write}$ (i.e., $V_{write}'<V_{write}$) to perform a write operation. The memory array 1400 with the selector structure 100 may, therefore, have a low power consumption as a consequence of the low leakage current in the selector structure.

The selector structure 100 may also provide the memory array 1400 with a greater (e.g., wider) $V_{read}$ window than a typical OTS selector due to the selector structure 100 having a lower threshold voltage than the typical OTS selector. A $V_{read}$ window may be determined by the difference between a setting voltage ($V_{set}$) of the resistive element 402*b* (e.g., NVM) and the threshold voltage $V_t$ of the selector structure 100 (e.g., $V_{read}$ window=$V_{set}-V_t$). Thus, the memory array 1400 including the selector structure 100 may have a low threshold voltage leading to a greater read margin (e.g., wider read margin) for operation.

Figure 15:
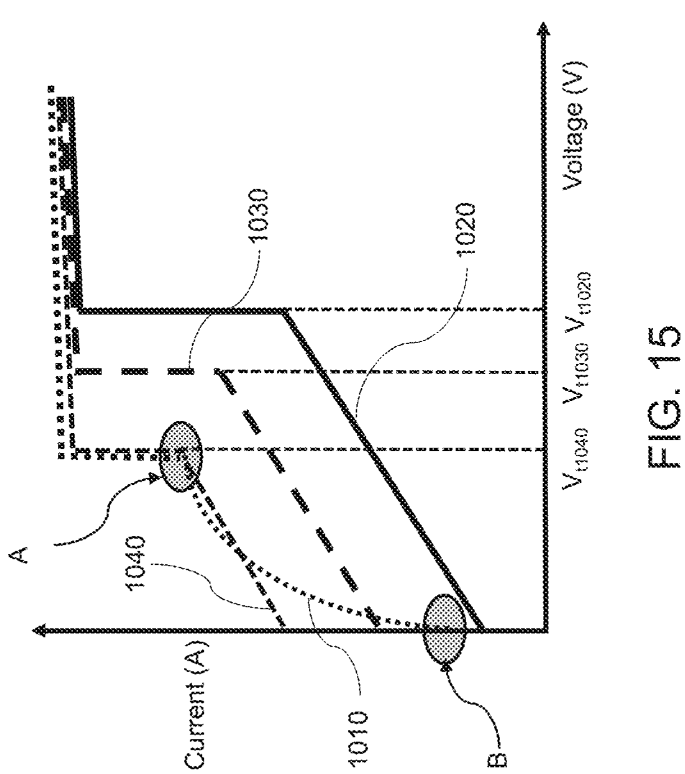
FIG. 15 provides a graph illustrating a voltage-current profile for the selector structure, according to one or more embodiments.

FIG. 15 provides a graph illustrating a voltage-current profile for the selector structure 100, according to one or more embodiments. In particular, the graph illustrates a voltage-current profile 1010 for the selector structure 100 at room temperature, a voltage-current profile 1020 for a typical OTS-based selector at room temperature, a voltage-current profile 1030 for a typical OTS-based selector at room temperature plus ΔT1 a voltage-current profile 1040 for a typical OTS-based selector at room temperature plus ΔT2 greater than ΔT1.

As illustrated in the graph of FIG. 15, the threshold voltage Vt may be inversely related to the temperature. In particular, the threshold voltage $V_{t1020}$ for the voltage-current profile 1020 may have the highest threshold voltage, followed by the threshold voltage $V_{t1030}$ for the voltage-current profile 1030, followed by the threshold voltage $V_{t1040}$ for the voltage-current profile 1040.

As also illustrated by highlighted region A in the graph of FIG. 15, the threshold voltage for the voltage-current profile 1010 for the selector structure 100 may be substantially the same as the $V_{t1040}$ for the voltage-current profile 1040. Further, the highlighted region B in the graph of FIG. 15, illustrates the fact that the selector structure 100 may have a lower leakage current that the typical OTS-based selector.

Figure 16:
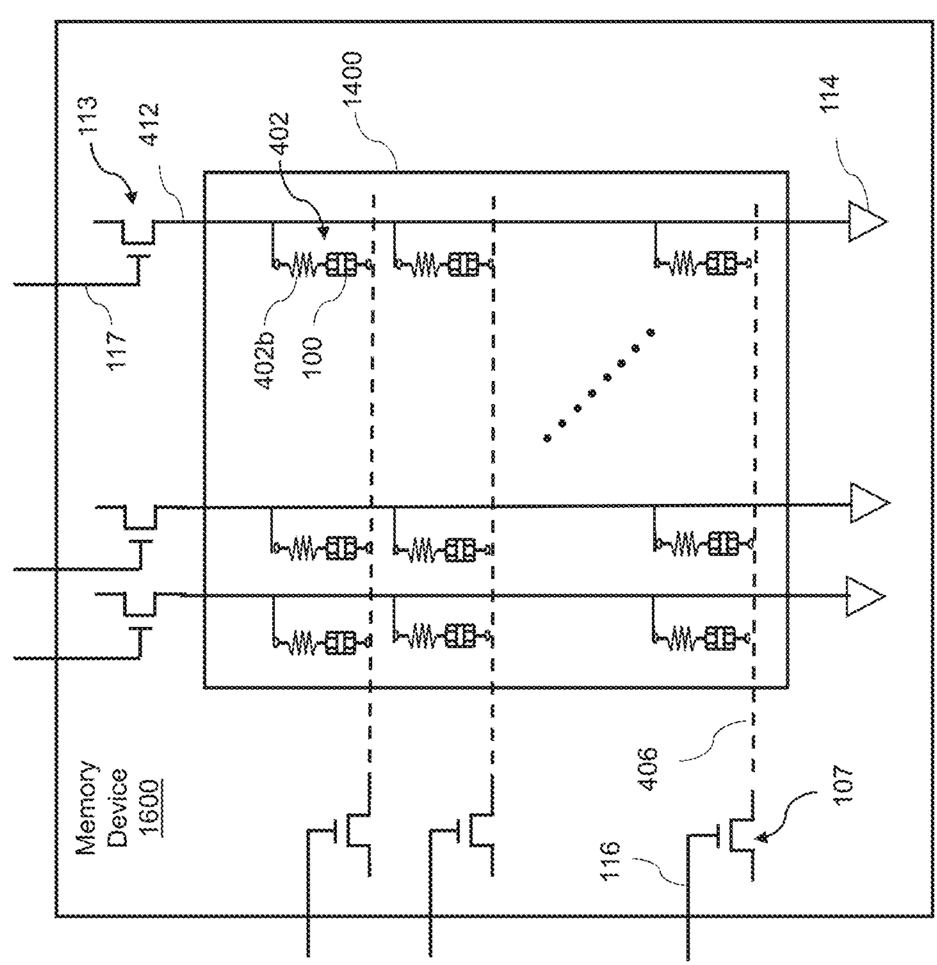
FIG. 16 illustrates a memory device including the memory array, according to one or more embodiments.

FIG. 16 illustrates a memory device 1600 including the memory array 1400, according to one or more embodiments. The memory array 1400 may include any suitable number of rows and columns. For example, the memory array 1400 may include R number of rows and C number of columns, where R is an integer greater than or equal or one and C is a number greater than or equal to two.

A row of the memory cells 402 may be operatively connected to a word line 406 of the plurality of word lines 406. Each of the word lines 406 may be operatively connected to a word line select switch 107. The word line select switches 107 may select a particular word line 406 based on a word line select signal that may be received on a word line select signal line 116. The word line select signal 116 may be generated inside the memory device 1600 or outside the memory device 1600. The word line select switches 107 may be included, for example, in a word line select circuit.

The word line select switches 107 may include, for example, a transistor (e.g., field effect transistor (FET)).

A column of memory cells 402 may be operatively connected to a bit line 412 of the plurality of bit lines 412. Each of the bit lines 412 may be operatively connected to a bit line select switch 113. The bit line select switches 113 may select a particular bit line 412 based on a bit line select signal that is received on a bit line select signal line 117. The bit line select signal may be generated inside the memory device 1600 or outside the memory device 1600. The bit line select switches 113 may be included, for example, in a bit line select circuit. The bit line select switches 107 may also include, for example, a transistor (e.g., field effect transistor (FET)).

A processing device (not shown) may be operatively connected to the memory array 1400 and may control an operation (e.g., write operation, read operation, etc.) on the memory array 1400. In particular, the processing device may be connected to the word lines 406, word line select switches 107, bit lines 412 and bit line select switches 113. For example, the processing device may generate the word line select signal and bit line select signal. The processing device may include, for example, a central processing unit, a microprocessor, an application specific integrated circuit, a graphics processing unit, a field programmable gate array, or some combination thereof.

A power supply (not shown) may also be operatively connected to the memory array 1400 and the processing device. In cooperation with the power supply, the processing device may cause one or more bias voltages to be applied to the memory cells 402 in the memory array 1400.

The processing device and/or the power supply may be inside the memory device 1600 or outside the memory device 1600. In particular, the processing device and/or the power supply may be disposed in the same circuitry (e.g., the same integrated circuit) as the memory array 1400, or the processing device and/or the power supply may be disposed in separate circuitry from the memory array 1400 and operatively connected to the memory array 1400. The memory device 1600, the processing device, and the power supply may be included, for example, in an integrated circuit for an electronic device such as a computer, phone, television, camera, and wearable device, etc.

When data is to be written to a memory cell 402 (e.g., the memory cell 402 is to be programmed), or when data is to be read from a memory cell 402, a word line select signal may be received on a word line select signal line 116 for the word line 406 associated with the memory cell 402. The word line select signal may turn ON the word line select switch 107 on the associated word line 406 so as to activate or assert the associated word line 406. In addition, a bit line select signal may be received on a bit line select signal line 117 for the bit line 412 associated with the memory cell 402. The bit line select signal may turn ON the bit line select switch 113 on the associated bit line 412 so as to activate or assert the associated bit line 412. The data may be then written to, or read from, the memory cell 402.

The memory device 1600 may also include one or more sense amplifiers 114 (e.g., differential amplifiers) connected to the plurality of bit lines 412. When data is to be read from a selected memory cell 402, a voltage may be applied to the word line 406 associated with the selected memory cell 402 and the bit line 412 associated with the selected memory cell 402. This may cause a sensible current (e.g. low voltage signal) to be generated on the bit line 113 associated with the selected memory cell 402. The signal may represent the data (1 or 0) stored in the read memory cell 402. The sense amplifier 114 may sense the signal and amplify the signal.

Referring to FIGS. 1A-16, a selector structure 100 may include a bottom electrode 120 including a bottom low thermal conductivity (LTC) metal **120*a* and a first bottom high thermal conductivity (HTC) metal 120*b*, a first switching film 140 on the bottom electrode 120 and having an electrical resistivity switchable by an electric field, and a first top electrode 160 on the first switching film 140 and including a first top low thermal conductivity (LTC) metal 160*a* and a first top high thermal conductivity (HTC) metal 160*b*. The first top HTC metal 160*b* may be substantially aligned with the first bottom HTC metal 120*b* in a thickness direction. Each of the first top HTC metal 160*b* and the first bottom HTC metal 120*b* may include a proximal end and a distal end, and a width of the distal end may be greater than a width of the proximal end. The first top HTC metal 160*b* may be located in a central region of the first top electrode 160, and the first bottom HTC metal 120*b* may be located in a central region of the bottom electrode 120. The first top LTC metal 160*a* may be located on opposing sides of the first top HTC metal 160*b*, and the bottom LTC metal 120*a* may be located on opposing sides of the first bottom HTC metal 120*b*. The first switching film 140 may include an ovonic threshold switching (OTS) film including at least one of selenium, tellurium or germanium. A width of the first top electrode 160 and a width of the bottom electrode 120 may be substantially the same as a width of the first switching film 140. The first switching film 140 may have a thickness in a range from about 5 nm to about 50 nm. Each of the first top electrode 160 and bottom electrode 120 may have a thickness in a range from about 1 nm to about 500 nm. A ratio of a thermal conductivity of the first top LTC metal 160*a* to a thermal conductivity of the first top HTC metal 160*b*, and a ratio of a thermal conductivity of the bottom LTC metal 120*a* to a thermal conductivity of the first bottom HTC metal 120*b* may each be in a range of about 1:10 to about 1:10,000. A ratio of a contact area of the first top LTC metal 160*a* to a contact area of the first top HTC metal 160*b*, and a ratio of a contact area of the bottom LTC metal 120*a* to a contact area of the first bottom HTC metal 120*b* may each be in a range of about 1:1 to about 10,000:1. A shape of the selector structure 100 may include one of a circular cylinder or a square cylinder. The selector structure 100 may further include a first selector 501 including the bottom electrode 120, the first switching film 140, and the first top electrode 160, and a second selector 502 including the bottom electrode 120, a second switching film 540 on the bottom electrode 120, and a second top electrode 560 on the second switching film 540, wherein the second top electrode 560 may include a second top HTC metal and a second top LTC metal, and the bottom electrode 120 further may include a second bottom HTC metal 520*b* that may be substantially aligned with the second top HTC metal 560*b* in the thickness direction. The bottom electrode 120 further may include an HTC coupling line 125 connecting the first bottom HTC metal 120*b* to the second bottom HTC metal 520*b***.

Referring to FIGS. 1A-16, a memory cell 402, includes a resistive element **402*b*, and a selector structure 100 electrically coupled to the resistive element 402*b*, may include a bottom electrode 120 including a bottom low thermal conductivity (LTC) metal 120*a* and a bottom high thermal conductivity (HTC) metal 120*b*, a switching film 140 on the bottom electrode 120 and having an electrical resistivity switchable by an electric field, and a top electrode 160 on the switching film 140 and including a top low thermal conductivity (LTC) metal 160***b* and a top high thermal conductivity (HTC) metal 160*a*. The top HTC metal 160*b* may be substantially aligned with the bottom HTC metal 120*b* in a thickness direction. Each of the top HTC metal 160*b* and the bottom HTC metal 120*b* may include a proximal end and a distal end, and a width of the distal end may be greater than a width of the proximal end.

Referring to FIGS. 1A-16, memory array 1400 may include a plurality of word lines 406, a plurality of bit lines 412 extending perpendicularly to the plurality of word lines 406, and a plurality of memory cells 402 located at intersections of the plurality of word lines 406 and plurality of bit lines 412, respectively, wherein a first memory cell 402 of the plurality of memory cells 402 may include a first resistive element 402*b*, and a first selector 501 of a selector structure 100, wherein the first selector 501 may be electrically coupled to the first resistive element 402*b* and may include a bottom electrode 120 including a bottom low thermal conductivity (LTC) metal 120*a* and a first bottom high thermal conductivity (HTC) metal 120*b*, a first switching film 140 on the bottom electrode 120 and having an electrical resistivity switchable by an electric field, and a first top electrode 160 on the first switching film 140 and including a first top low thermal conductivity (LTC) metal 160*a* and a first top high thermal conductivity (HTC) metal 160*b*. A second memory cell 402 of the plurality of memory cells 402 may include a second resistive element 402*b*, and a second selector 502 of the selector structure 100, wherein the second selector 502 may be electrically coupled to the second resistive element 402*b* and may include the bottom electrode 120, a second switching film 540 on the bottom electrode 120, and a second top electrode 560 on the second switching film 540, wherein the second top electrode 560 may include a second top HTC metal 560*b* and the bottom electrode 120 further may include a second bottom HTC metal 520*b* that may be substantially aligned with the second top HTC metal 560*b* in the thickness direction. A word line 406 of the plurality of word lines 406 may be coupled to the bottom electrode 120, a first bit line 412 of the plurality of bit lines 412 may be coupled to the first top electrode 160 of the first memory cell, and a second bit line 412 of the plurality of bit lines 412 may be coupled to the second top electrode 560 of the second memory cell 402.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A selector structure, comprising:

a bottom electrode including a bottom low thermal conductivity (LTC) metal and a first bottom high thermal conductivity (HTC) metal, wherein a thermal conductivity of the first bottom HTC metal is greater than a thermal conductivity of the bottom LTC metal;

a first switching film on the bottom electrode and having an electrical resistivity switchable by an electric field; and a first top electrode on the first switching film and including a first top low thermal conductivity (LTC) metal and a first top high thermal conductivity (HTC) metal, wherein a thermal conductivity of the first top HTC metal is greater than a thermal conductivity of the first top LTC metal.

2. The selector structure of claim 1, wherein the first top HTC metal is aligned with the first bottom HTC metal in a thickness direction.

3. The selector structure of claim 1, wherein each of the first top HTC metal and the first bottom HTC metal comprises a proximal end and a distal end, and a width of the distal end is greater than a width of the proximal end.

4. The selector structure of claim 1, wherein the first top HTC metal is located in a central region of the first top electrode, and the first bottom HTC metal is located in a central region of the bottom electrode.

5. The selector structure of claim 1, wherein the first top LTC metal is located on opposing sides of the first top HTC metal, and the bottom LTC metal is located on opposing sides of the first bottom HTC metal.

6. The selector structure of claim 1, wherein the first switching film comprises an ovonic threshold switching (OTS) film including at least one of selenium, tellurium or germanium.

7. The selector structure of claim 1, wherein a width of the first top electrode and a width of the bottom electrode are the same as a width of the first switching film.

8. The selector structure of claim 1, wherein the first switching film has a thickness in a range from about 5 nm to about 50 nm.

9. The selector structure of claim 1, wherein each of the first top electrode and the bottom electrode each has a thickness in a range from about 1 nm to about 500 nm.

10. The selector structure of claim 1, wherein a ratio of a thermal conductivity of the first top LTC metal to a thermal conductivity of the first top HTC metal, and a ratio of a thermal conductivity of the bottom LTC metal to a thermal conductivity of the first bottom HTC metal are each in a range of about 1:10 to about 1:10,000.

11. The selector structure of claim 1, wherein a ratio of a contact area of the first top LTC metal to a contact area of the first top HTC metal, and a ratio of a contact area of the bottom LTC metal to a contact area of the first bottom HTC metal are each in a range of about 1:1 to about 10,000:1.

12. The selector structure of claim 1, wherein a shape of the selector structure comprises one of a circular cylinder and a square cylinder.

13. The selector structure of claim 1, further comprising:

a first selector including the bottom electrode, the first switching film, and the first top electrode; and a second selector including the bottom electrode, a second switching film on the bottom electrode, and a second top electrode on the second switching film, wherein the second top electrode comprises a second top HTC metal and a second top LTC metal, and the bottom electrode further comprises a second bottom HTC metal that is aligned with the second top HTC metal in the thickness direction.

14. The selector structure of claim 13, wherein the bottom electrode further comprises an HTC coupling line connecting the first bottom HTC metal to the second bottom HTC metal.

15. A memory cell, comprising:

a resistive element; and a selector structure electrically coupled to the resistive element, comprising:

a bottom electrode including a bottom low thermal conductivity (LTC) metal and a bottom high thermal conductivity (HTC) metal, wherein a thermal conductivity of the bottom HTC metal is greater than a thermal conductivity of the bottom LTC metal;

a switching film on the bottom electrode and having an electrical resistivity switchable by an electric field; and a top electrode on the switching film and including a top low thermal conductivity (LTC) metal and a top high thermal conductivity (HTC) metal, wherein a thermal conductivity of the top HTC metal is greater than a thermal conductivity of the top LTC metal.

16. The memory cell of claim 15, wherein the top HTC metal is aligned with the bottom HTC metal in a thickness direction.

17. The memory cell of claim 15, wherein each of the top HTC metal and the bottom HTC metal comprises a proximal end and a distal end, and a width of the distal end is greater than a width of the proximal end.

18. A memory array, comprising:

a plurality of word lines;

a plurality of bit lines extending perpendicularly to the plurality of word lines; and a plurality of memory cells located at intersections of the plurality of word lines and plurality of bit lines, respectively, wherein a first memory cell of the plurality of memory cells comprises:

a first resistive element; and a first selector of a selector structure, wherein the first selector is electrically coupled to the first resistive element and comprises:

a bottom electrode including a bottom low thermal conductivity (LTC) metal and a bottom high thermal conductivity (HTC) metal, wherein a thermal conductivity of the bottom HTC metal is greater than a thermal conductivity of the bottom LTC metal;

a first switching film on the bottom electrode and having an electrical resistivity switchable by an electric field; and a first top electrode on the first switching film and including a first top low thermal conductivity (LTC) metal and a first top high thermal conductivity (HTC) metal, wherein a thermal conductivity of the first top HTC metal is greater than a thermal conductivity of the first top LTC metal.

19. The memory array of claim 18, wherein a second memory cell of the plurality of memory cells comprises:

a second resistive element; and a second selector of the selector structure, wherein the second selector is electrically coupled to the second resistive element and comprises:

the bottom electrode;

a second switching film on the bottom electrode; and a second top electrode on the second switching film, wherein the second top electrode comprises a second top HTC metal and the bottom electrode further comprises a second bottom HTC metal that is aligned with the second top HTC metal in the thickness direction.

20. The memory array of claim 19, wherein a word line of the plurality of word lines is coupled to the bottom electrode, a first bit line of the plurality of bit lines is coupled to the first top electrode of the first memory cell, and a second bit line of the plurality of bit lines is coupled to the second top electrode of the second memory cell.

* * * * *